United States Patent
Umezu et al.

(10) Patent No.: US 11,049,911 B2
(45) Date of Patent: Jun. 29, 2021

(54) LIGHT-EMITTING DEVICE AND IMAGE DISPLAY APPARATUS INCLUDING THE SAME

(71) Applicant: DIC Corporation, Tokyo (JP)

(72) Inventors: Yasuo Umezu, Kitaadachi-gun (JP); Hidehiko Yamaguchi, Kitaadachi-gun (JP); Yoshio Aoki, Kitaadachi-gun (JP); Shinji Ogawa, Kitaadachi-gun (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 16/465,309

(22) PCT Filed: Dec. 21, 2017

(86) PCT No.: PCT/JP2017/045920
§ 371 (c)(1),
(2) Date: May 30, 2019

(87) PCT Pub. No.: WO2018/123805
PCT Pub. Date: Jul. 5, 2018

(65) Prior Publication Data
US 2019/0393273 A1    Dec. 26, 2019

(30) Foreign Application Priority Data
Dec. 28, 2016 (JP) .............................. JP2016-255101

(51) Int. Cl.
*H01L 27/32* (2006.01)
*H01L 51/50* (2006.01)
*H01L 51/52* (2006.01)

(52) U.S. Cl.
CPC ........ *H01L 27/322* (2013.01); *H01L 27/3211* (2013.01); *H01L 51/5036* (2013.01);
(Continued)

(58) Field of Classification Search
CPC ............... H01L 27/322; H01L 27/3211; H01L 51/5036; H01L 51/5206; H01L 51/5221;
(Continued)

(56) References Cited

U.S. PATENT DOCUMENTS 8,343,576 B2 * 1/2013 Banin ..................... C30B 7/005
427/215
10,712,614 B2 * 7/2020 Lee .................... G02F 1/133512
(Continued)

FOREIGN PATENT DOCUMENTS

JP        10-12383 A    1/1998
JP        2007-5211 A   1/2007
(Continued)

OTHER PUBLICATIONS

International Search Report dated Mar. 6, 2018, issued in counterpart application No. PCT/JP2017/045920 (2 pages).
(Continued)

*Primary Examiner* — Karen Kusumakar
(74) *Attorney, Agent, or Firm* — Westerman, Hattori, Daniels & Adrian, LLP

(57) ABSTRACT

It is an object of the present invention to provide an image display apparatus capable of inhibiting or preventing the deterioration of a light conversion layer while high luminous efficiency and high color reproducibility are achieved. The present invention provides a light-emitting device including a pair of electrodes, an electroluminescent layer disposed between a first electrode and a second electrode, a light conversion layer including multiple pixels and converting light that is emitted from the electroluminescent layer and that has a blue emission spectrum into light having a different wavelength. The light conversion layer includes pixels of three primary colors of red (R), green (G), and blue (B) and contains a light-emitting nanocrystal having an
(Continued)

emission spectrum in any of red (R), green (G), and blue (B) when light from the electroluminescent layer is incident on at least one of the three primary colors.

13 Claims, 9 Drawing Sheets

(52) U.S. Cl.
CPC ...... *H01L 51/5206* (2013.01); *H01L 51/5221* (2013.01); *H01L 2251/5376* (2013.01)

(58) Field of Classification Search
CPC ......... H01L 2251/5376; H01L 51/5284; H01L 51/5012; H01L 2251/5369; H01L 27/32; H01L 51/50; G02B 5/201; G02B 1/14; G02B 5/206; C09K 11/06; C09K 11/54; C09K 11/56; C09K 11/70; H05B 33/02; H05B 33/12

See application file for complete search history.

(56) References Cited

U.S. PATENT DOCUMENTS

| | | |
|---|---|---|
| 2002/0015110 A1 | 2/2002 | Brown Elliott |
| 2006/0158103 A1 | 7/2006 | Katano et al. |
| 2008/0001528 A1 | 1/2008 | Eida |
| 2008/0029710 A1 | 2/2008 | Sekiya et al. |
| 2015/0144900 A1* | 5/2015 | Lee ..................... H01L 51/5262 257/40 |
| 2015/0185381 A1* | 7/2015 | Wu ................... G02F 1/133617 349/106 |

FOREIGN PATENT DOCUMENTS

| | | |
|---|---|---|
| JP | 2007-299825 A | 11/2007 |
| JP | 2008-10298 A | 1/2008 |
| JP | 2008-41361 A | 2/2008 |
| JP | 2011-209754 A | 10/2011 |
| JP | 2013-137931 A | 7/2013 |
| JP | 2015-125994 A | 7/2015 |
| TW | 200614864 A | 5/2006 |
| WO | 2006/008987 A1 | 1/2006 |

OTHER PUBLICATIONS

Office Action dated Mar. 17, 2021, issued in counterpart CN Application No. 201780073696.2, with English translation (16 pages).

Office Action dated Feb. 23, 2021, issued in counterpart TW Application No. 106146262 (7 pages).

* cited by examiner

LIGHT-EMITTING DEVICE AND IMAGE DISPLAY APPARATUS INCLUDING THE SAME

TECHNICAL FIELD

The present invention relates to a light-emitting device and an image display apparatus including the light-emitting device.

BACKGROUND ART

In recent years, flat-panel displays (FPDs) having thin flat screens have been in the mainstream of display devices in place of cathode-ray tubes (CRTs). Examples of FPDs include liquid crystal displays, organic electroluminescent (organic EL) displays, plasma displays, and field emission displays (FEDs). Recently, the developments of organic EL displays and liquid crystal displays have been particularly actively conducted. The development of mobile computing increases demands for display devices for portable information terminals and requires reductions in weight and power consumption of display devices and the development of a foldable display device. For these reasons, self-luminous organic EL devices have been receiving attention.

EL devices such as organic EL devices are self-luminous, do not require a back-light, can be made thin and lightweight, have a few members, and can be easily made foldable. However, El devices have problems such as display defects due to deterioration of light-emitting members. Specifically, it is necessary to solve problems such as high cost due to poor yield during the production of devices, image-sticking of devices due to their lifetimes, and display unevenness. Additionally, in the case of a full-color organic EL device, red, green, and blue need to be independently emitted. In particular, the foregoing problems are likely to occur in blue, which is a high energy ray with a short wavelength. There is also a problem such as the yellowing of devices due to the fading of blue in long-term use.

To absorb the difference in the rate of deterioration among members that emit three primary colors of light, various methods have been examined. For example, disclosed is a method for increasing the size of blue pixels using the fact that the human eye has few blue receptors and low sensitivity, instead of reducing the number of blue pixels with respect to the number of other pixels (see Patent Literature 1). In this method, although the blue pixels can be relatively large in size and the lifetime of the blue pixels can be equivalent to those of other pixels, there is a problem that the display quality has to be sacrificed.

As a method for eliminating the difference in characteristics among pixels, a structure is disclosed in which color filters of the primary colors (red, green, and blue) are arranged on an organic EL device that emits white light (see Patent Literature 2). This method has the following advantages: the use of the pixels composed of the same material eliminates differences in characteristics among the pixels and enables all pixels to have the same size. To obtain white light, typically, a method in which a blue LED and a yellow phosphor are combined together is often employed and advantageously has good efficiency. However, the white light source disadvantageously has insufficient characteristics such as lack of red light. In the case of using the color filters, an improvement in color reproducibility decreases the transmittance of the color filters. The amount of light must be increased, thus disadvantageously increasing the power consumption. It is disadvantageously difficult to achieve differentiation from liquid crystal devices.

As a method for achieving full-color display without using a color filter, a method is disclosed in which blue light or ultraviolet light from a light-emitting layer is used as a primary light source and a wavelength conversion layer composed of, for example, phosphor materials is irradiated with light emitted from the light source to produce three primary colors as a secondary light source (see Patent Literature 3). In this method, because the light source may emit a single color, there is no difference in characteristics among three primary colors, and there are only a few problems such as a decrease in transmittance due to a color filter. Furthermore, a technique in which quantum dots are used in a wavelength conversion layer has been receiving attention. Quantum dots are formed of semiconductor microcrystals having a particle size of several nanometers to several tens of nanometers and have discrete energy levels due to the confinement effect of electron-hole pairs and a property that a smaller particle size results in a larger energy band gap. A wavelength conversion layer having a narrow full width at half maximum of an emission spectrum can be obtained by the use of the property, i.e., by controlling the particle diameter to equalize the band gap (see Patent Literature 4).

CITATION LIST

Patent Literature

PTL 1: Japanese Unexamined Patent Application Publication No. 2011-209754
PTL 2: Japanese Unexamined Patent Application Publication No. 10-12383
PTL 3: Japanese Unexamined Patent Application Publication No. 2015-125994
PTL 4: Japanese Unexamined Patent Application Publication No. 2013-137931

SUMMARY OF INVENTION

Technical Problem

Regarding the characteristics of a phosphor material having quantum dots used as a material of the wavelength conversion layer and a light-emitting layer serving as a primary light source, there are problems that the optimization of the characteristics thereof is indispensable for the achievement of an optimum color gamut and that the material therefor is difficult to select. If light-emitting nanocrystals such as quantum dots and a light-emitting layer are insufficiently optimized, a wavelength conversion layer cannot sufficiently absorb light from the light-emitting layer serving as a primary light source. Thus, light that cannot be absorbed by the wavelength conversion layer is transmitted therethrough. Light converted by the wavelength conversion layer and light from the primary light source, which is the light-emitting layer, are mixed together to cause a problem of the decrease of the color reproducibility or a problem of coloring due to the degradation of the wavelength conversion layer.

From the above reasons, in the display device having a structure in which blue light or ultraviolet light emitted from a light-emitting layer is used as a primary light source and a wavelength conversion layer composed of, for example, a phosphor material is irradiated with light emitted from the light source to produce three primary colors as a secondary light source, the optimization of the primary light source and the wavelength conversion layer is required.

It is an object of the present invention to provide a light-emitting device capable of inhibiting or preventing the deterioration of a light conversion layer while high luminous efficiency and high color reproducibility are achieved, and an image display apparatus including the light-emitting device.

It is another object of the present invention to provide a light-emitting device capable of inhibiting or preventing the color mixing of light from a light-emitting layer and light that has passed through a light conversion layer, and an image display apparatus including the light-emitting device.

Solution to Problem

The inventors have conducted intensive studies to solve the foregoing problems and have found that the problems can be solved by the use of a light-emitting device including a pair of electrodes including a first electrode and a second electrode disposed opposite each other, an electroluminescent layer disposed between the first electrode and the second electrode, and a light conversion layer including multiple pixels and converting light that is emitted from the electroluminescent layer and that has a blue emission spectrum into light having a different wavelength, in which the light conversion layer includes pixels of three primary colors of red (R), green (G), and blue (B) and contains a light-emitting nanocrystal having an emission spectrum in any of red (R), green (G), and blue (B) when light from the electroluminescent layer is incident on at least one of the three primary colors. The finding has led to the completion of the present invention.

Advantageous Effects of Invention

The light-emitting device of the present invention has good transmittance and maintains a color gamut for a long time.

The light-emitting device of the present invention can inhibit or prevent the color mixing of light from a light-emitting layer and light that has passed through the light conversion layer.

The image display apparatus of the present invention is not easily degraded by high-energy rays such as short-wavelength visible light and ultraviolet light, and maintains a color gamut for a long time.

The image display apparatus of the present invention can inhibit or prevent the color mixing of light from the light-emitting layer and light that has passed through the light conversion layer.

DESCRIPTION OF EMBODIMENTS

A first aspect of the present invention is directed to providing a light-emitting device including a pair of electrodes including a first electrode and a second electrode disposed opposite each other, an electroluminescent layer disposed between the first electrode and the second electrode, and a light conversion layer including multiple pixels and converting light that is emitted from the electroluminescent layer and that has a blue emission spectrum into light having a different wavelength, in which the light conversion layer includes pixels of three primary colors of red (R), green (G), and blue (B) and contains a light-emitting nanocrystal having an emission spectrum in any of red (R), green (G), and blue (B) when light from the electroluminescent layer is incident on at least one of the three primary colors.

The light-emitting device of the present invention has good transmittance and maintains a color gamut for a long time.

The structure of the light-emitting device according to a preferred embodiment of the present invention will be described below with reference to FIGS. 1 to 7.

Figure 1:
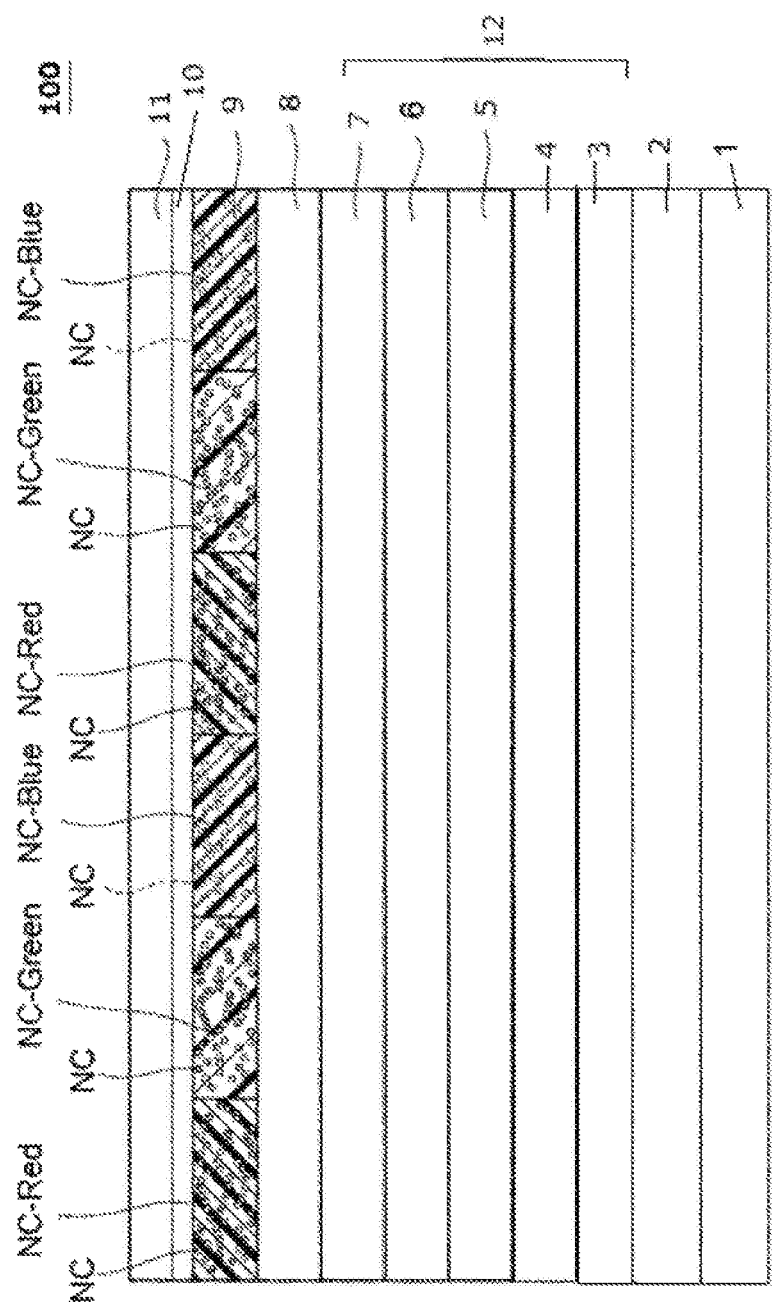
FIG. 1 is a schematic cross-sectional view illustrating a light-emitting device of the present invention.

FIG. 1 is a schematic cross-sectional view illustrating a light-emitting device 100 of the present invention. The light-emitting device 100 of the present invention includes a first electrode 2 and a second electrode 8 serving as a pair of opposite electrodes, an electroluminescent layer 12 disposed between the electrodes, and a light conversion layer 9 on the second electrode 8. The electroluminescent layer 12 according to the present invention may include at least a light-emitting layer 5. The electroluminescent layer 12 according to the present invention preferably includes an electron transport layer 6, the light-emitting layer 5, a hole transport layer 4, and a hole injection layer 3. The electroluminescent layer 12 according to the present invention preferably includes an electron injection layer 7, the electron transport layer 6, the light-emitting layer 5, the hole transport layer 4, and the hole injection layer 3. Additionally, an electron-blocking layer (not illustrated) may be disposed between the light-emitting layer 5 and the hole transport layer 4 in order to enhance the external quantum efficiency and improve the light emission intensity. Similarly, a hole-blocking layer (not illustrated) may be disposed between the light-emitting layer 5 and the electron transport layer 6 in order to enhance the external quantum efficiency and improve the light emission intensity.

In the light-emitting device 100, the electroluminescent layer 12 has a structure in which the hole injection layer 3 in contact with the first electrode 2, the hole transport layer 4, the light-emitting layer 5, and the electron transport layer 6 are stacked in this order.

In an embodiment of the present invention, in the following description, for convenience, the first electrode 2 serves as an anode, and the second electrode 8 serves as a cathode. However, the structure of the light-emitting device 100 is not limited thereto. The first electrode 2 serving as a cathode and the second electrode 8 serving as an anode may be used, and the layers between these electrodes may be stacked in reverse order. In other words, the hole injection layer 3, the hole transport layer 4, the electron-blocking layer disposed as needed, the light-emitting layer 5, the hole-blocking layer disposed as needed, the electron transport layer 6, and the electron injection layer 7 may be stacked in this order from the second electrode 8 adjacent to the anode.

The light conversion layer 9 according to the present invention serves as what is called a color layer, includes pixels of three primary colors of red (R), green (G), and blue (B), and contains light-emitting nanocrystals. When at least one color pixel among the three primary colors is irradiated with light that is emitted from the electroluminescent layer 12 and that has a blue emission spectrum, the light-emitting nanocrystals convert the light into light having an emission spectrum in any of red (R), green (G), and blue (B).

One of the features of the present invention is that the light conversion layer 9 containing the light-emitting nanocrystals NC is used as an alternative member to a color filter. Thus, the light conversion layer 9 in the present invention includes the pixels of three primary colors, namely, red (R), green (G), and blue (B) and plays the same role as what is called a color filter.

Figure 2:
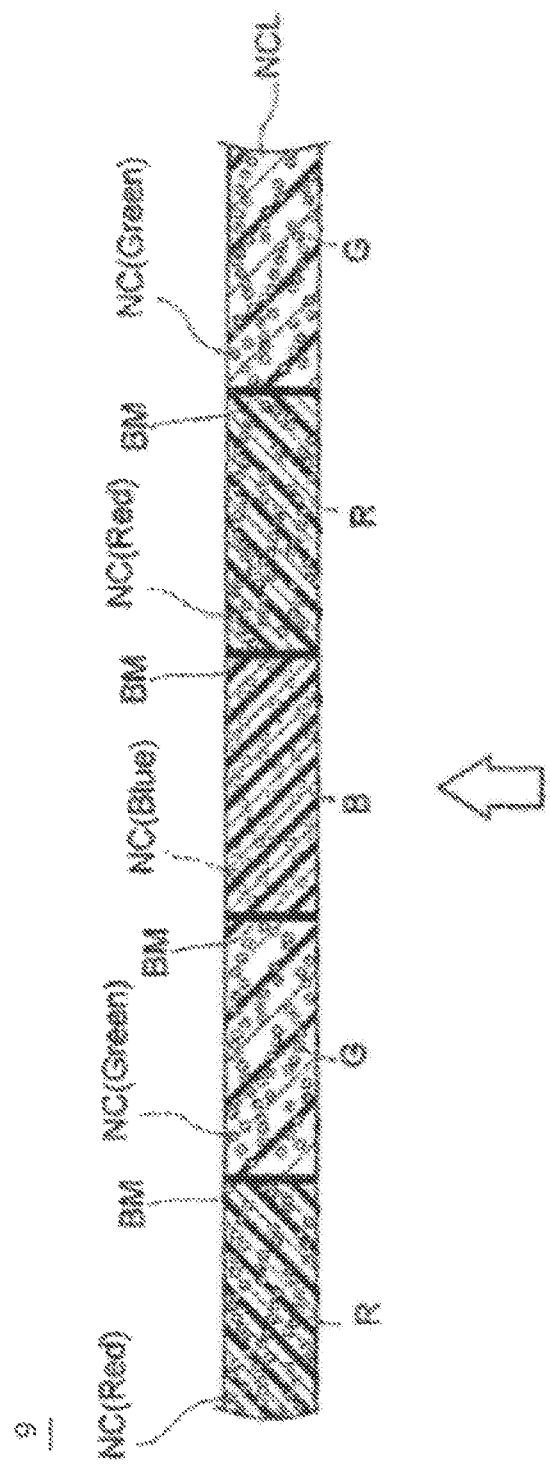
FIG. 2 is an enlarged schematic view illustrating an example of a light conversion layer according to the present invention.

Specifically, the light conversion layer 9, for example, includes a red (R) pixel portion (red color layer portion) including light conversion pixel layers containing red-light-emitting nanocrystals (NC-Red), a green (R) pixel portion (green color layer portion) including light conversion pixel layers containing green-light-emitting nanocrystals (NC-Green), and a blue (R) pixel portion (blue color layer portion) including light conversion pixel layers containing blue-light-emitting nanocrystals (NC-Blue). FIG. 2 illustrates an example of the light conversion layer 9 of a single-layer type.

FIG. 2 is an enlarged schematic view illustrating the light conversion layer 9 according to the present invention. The light conversion layer 9 includes red color layers R, green color layers G, and blue color layers B. A red (R) pixel portion R (red color layers R) is formed of light conversion pixel layers containing red-light-emitting nanocrystals (NC-Red). A green (G) pixel portion G (green color layers G) is formed of light conversion pixel layers containing green-light-emitting nanocrystals (NC-Green). A blue (B) pixel portion B (blue color layer B) is formed of (light conversion pixel) layers containing blue-light-emission nanocrystals as needed (or a transparent resin layer). Accordingly, the light conversion layer 9 is formed of a single nanocrystal layer NCL containing the red color layers R, the green color layers G, and the blue color layers B. To prevent color mixing, a black matrix BM serving as a light-shielding layer is disposed between the red color layers R, the green color layers G, and the blue color layers B.

Specifically, in the case where light having a main peak at or near 450 nm (light having a blue emission spectrum) is emitted from the electroluminescent layer 12, the blue light can be used as a blue color in the light conversion layer 9. Thus, in the case where light emitted from the electroluminescent layer 12 serving as a light source is blue light, the light conversion pixel layers (NC-Blue) may be omitted among the light conversion pixel layers for each color (NC-Red, NC-Green, and NC-Blue), and backlight may be used as a blue color on an as-is basis. In this case, the color layers that display the blue color may be formed of, for example, colorant layers containing a transparent resin or a blue colorant (i.e., a blue color filter). In FIGS. 1, 2, and so forth, because the blue-light-emitting nanocrystals can be an optional component, the blue-light-emission nanocrystals are indicated by a dot-and-dash line.

Each of the red color layers R, the green color layers G, and the blue color layers B may appropriately contain a colorant, as needed. Additionally, the layer (NCL) containing the light-emitting nanocrystals NC may contain colorants corresponding to the colors.

Figure 3:
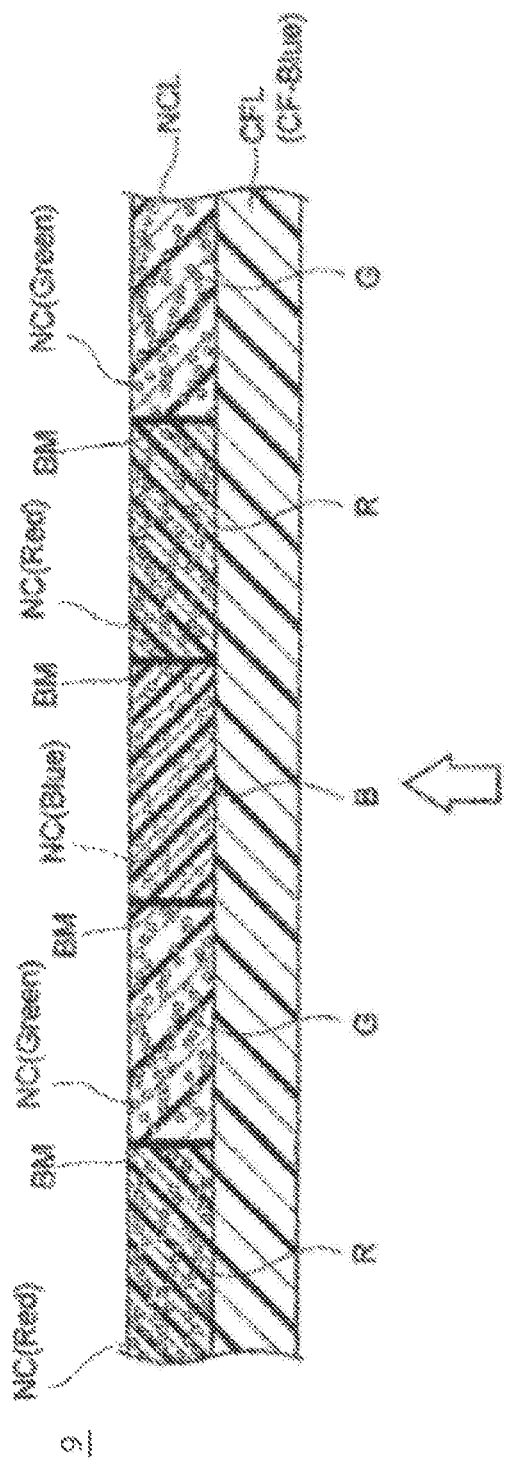
FIG. 3 is an enlarged schematic view illustrating another example of the light conversion layer according to the present invention.

In FIG. 1, a colorant layer containing a blue colorant (i.e., "blue color filter") is preferably disposed on one surface of part of the light conversion layer 9 between them in accordance with the electroluminescent layer 12 used or the wavelength of light emitted from the electroluminescent layer 12 because the entry of unwanted light from the outside can be prevented to inhibit a deterioration in image quality. FIG. 3 illustrates the structure of the light conversion layer 9 including the blue color filter according to a modified embodiment.

As a light conversion layer according to a preferred embodiment, the nanocrystal layer NCL illustrated in FIG. 2 and a colorant layer CFL (i.e., a color filter) containing a colorant are stacked in FIG. 3. In the case where light (excitation light, for example, blue light) from the electroluminescent layer cannot be completely converted in the light conversion layer, it is necessary to absorb the remaining excitation light without allowing the remaining excitation light to pass through the light conversion layer. Thus, the light conversion layer inhibits the remaining excitation light (blue light) from being viewed from the outside by stacking a layer (NC) containing light-emitting nanocrystals and the colorant layer CFL containing a colorant (i.e., a color filter). However, the colorant layer CFL containing a colorant (i.e., a color filter) may be omitted, as needed. In FIG. 3, a colorant layer containing a blue colorant is disposed as the color filter layer CFL because light having a main emission peak in a wavelength range of 420 nm to 480 nm is assumed to be used as a light source (light emission from the electroluminescent layer). However, the type of colorant layer is appropriately changed in accordance with the type of light source used.

Thereby, the image display apparatus of the present invention can inhibit or prevent the color mixing of light from the electroluminescent layer and light that has passed through the light conversion layer.

In the light-emitting device 100 illustrated in FIG. 1, the application of a voltage between the first electrode 2 and the second electrode 8 permits electrons to be injected from the second electrode 8 serving as a cathode into the electroluminescent layer 12 and permits holes to be injected from the first electrode 2 serving as an anode into the electroluminescent layer 12, so that a current flows. The electrons and the holes injected are recombined to form excitons. As a result, the light-emitting material contained in the light-emitting layer 5 is in an excited state to emit light from the light-emitting material. Then light emitted from the light-emitting layer 5 is incident on a surface of the light conversion layer 9 through the electron transport layer 6, the electron injection layer 7, and the second electrode. The light incident on the light conversion layer 9 is absorbed by the light-emitting nanocrystals and converted into light having an emission spectrum in any of red (R), green (G), and blue (B), so that any of red (R), green (G), and blue (B) can be displayed.

A preferred embodiment of the present invention provides a light-emitting device that displays any of red (R), green (G), and blue (B) by emitting blue light from the light-emitting layer 5, allowing the blue light to be incident on the light conversion layer 9, allowing the blue light to be absorbed by the light-emitting nanocrystals, and converting the absorbed blue light into light having an emission spectrum in any of red (R), green (G), and blue (B).

Color display methods in organic light-emitting devices (OLEDs) typically include (1) a display method in which light-emitting materials that exhibit three colors of red, green, and blue are separately formed into films; (2) a display method in which three colors are displayed by a combination of a light-emitting layer that emits blue light, a color conversion layer that converting the blue light from the light-emitting light into green light, and a color conversion layer that converting the blue light from the light-emitting layer into red light; and (3) a method in which a light-emitting layer that emits white light and red, green, and blue color filters are combined together. In the present invention, the display method (2) is preferred because colors are displayed using the light-emitting nanocrystals.

In the electroluminescent layer 12 according to the present invention, a single layer or multiple layers that provide various effects may be disposed for the purpose of reducing a potential barrier to injection of holes or electrons, improving the transport characteristics of holes or electrons, impairing the transport characteristics of holes or electrons, or inhibiting or preventing a quenching phenomenon due to the electrodes, if necessary.

Figure 10:
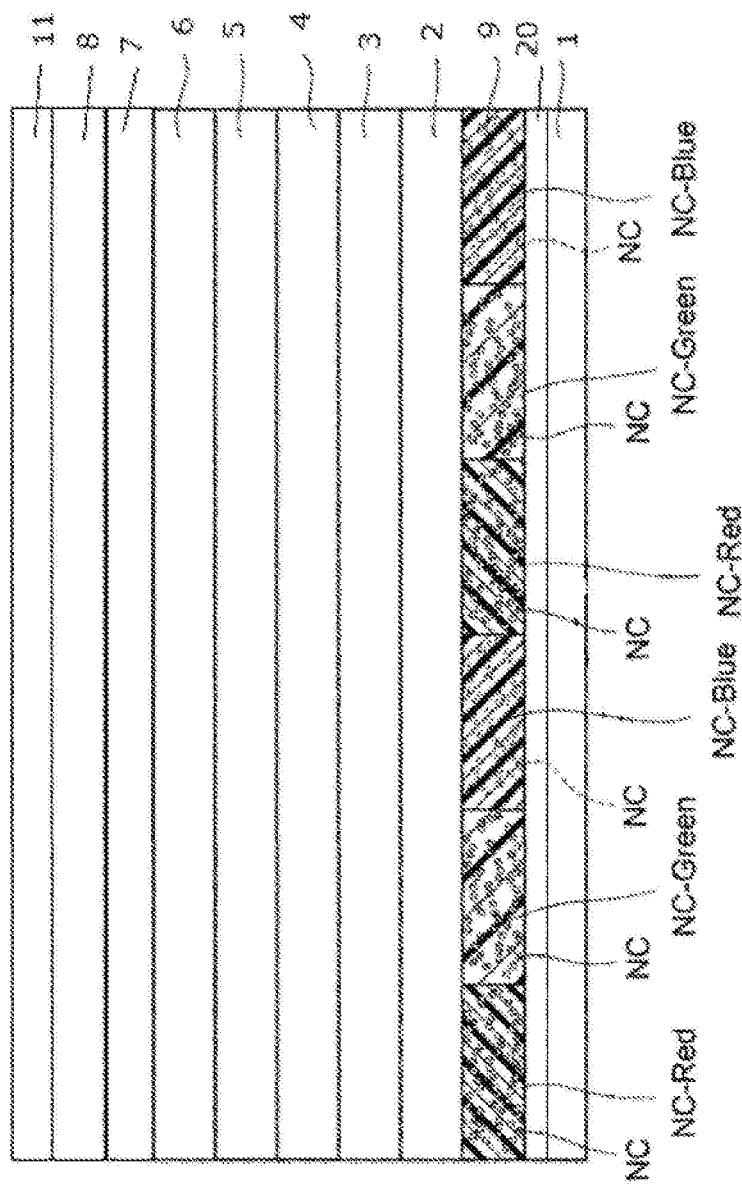
FIG. 10 is a schematic cross-sectional view illustrating an image display apparatus of the present invention.

An overcoat layer 10 may be disposed as a protective film so as to cover the light conversion layer 9. If necessary, a substrate 11 composed of, for example, glass may be bonded to the entire surface of the overcoat layer 10. In this case, a known adhesive (for example, a thermosetting or ultraviolet curable resin) may be disposed between the overcoat layer 10 and the substrate 11, as needed. As described below, in the case where the light-emitting device according to the present invention is a top emission type in which light emerges from the substrate 11, the overcoat layer 10 and the substrate 11 are preferably composed of a transparent material. As illustrated in FIG. 10 below, in the case of a bottom emission type in which light emerges from a substrate 11, the overcoat layer 10 and the substrate 11 are not particularly limited.

FIG. 1 illustrates a structure in which the first electrode 2 is disposed on the substrate 1. The substrate serves as a base that supports a stack including the first electrode 2, the electroluminescent layer 12, the second electrode 8, and the light conversion layer 9. A known substrate may be used as the substrate.

Figure 4:
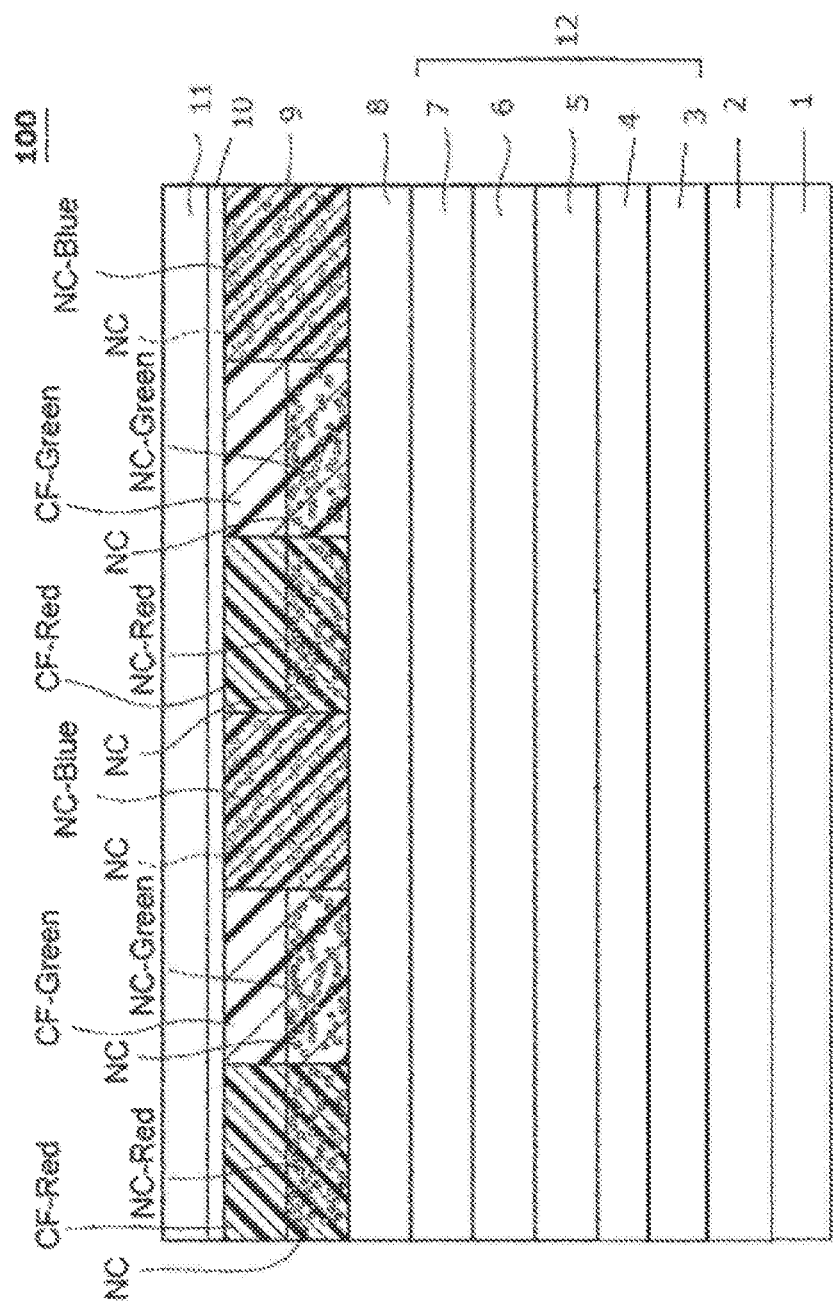
FIG. 4 is a schematic cross-sectional view illustrating a light-emitting device according to another embodiment of the present invention.

FIG. 4 is a schematic cross-sectional view illustrating the light-emitting device 100 according to another embodiment of the present invention. The structure according to the embodiment illustrated in FIG. 4 has the same structure as in FIG. 1, except for the light conversion layer 9; thus, the description is omitted here. In red and green color layer portions included in the light conversion layer 9 according to the embodiment illustrated in FIG. 4, the red color layer portion has a two-layer structure in which a light conversion pixel layer (NC-Red) containing red-light-emitting nanocrystals and a colorant layer (i.e., a red color filter) (CF-Red) containing a red colorant are stacked, and the green color layer portion has a two-layer structure in which a light conversion pixel layer (NC-Green) containing green-light-emitting nanocrystals that emit green light and a colorant layer (i.e., a green color filter) (CF-Green) containing a green colorant are stacked.

Regarding the two-layer structures of each color layer, when light emitted from the electroluminescent layer 12 cannot be entirely converted by the light conversion pixel layer containing the nanocrystals, a color filter (CFL) or a colorant layer for each color is stacked for the purpose of absorbing remaining excitation light without allowing the remaining excitation light to pass. More specifically, the light conversion layer 9 includes the red color layer portion, the green color layer portion, and a blue color layer portion. The red (R) pixel portion (red color layer portion) has the two-layer structure including the light conversion pixel layer (NC-Red) containing the red-light-emitting nanocrystals and the colorant layer (CF-Red) containing the red colorant. The green (G) pixel portion (green color layer portion) has the two-layer structure including the light conversion pixel layer (NC-Green) containing the green-light-emitting nanocrystals and the colorant layer (CF-Green) containing the green colorant. In this case, the green color layer portion illustrated in FIG. 4 may also be a combination of a light conversion pixel layer (NC-Green) containing green-light-emitting nanocrystals and a colorant layer (CF-Yellow) containing a yellow colorant in order to perform color correction in consideration of the transmission of the excitation light. The blue (B) pixel portion (blue color layer portion) is formed of a color layer (NC-Blue) optionally containing blue-light-emitting nanocrystals.

A preferred embodiment of the light conversion pixel layer (NC-Red) containing the red-light-emitting nanocrystals, the light conversion pixel layer (NC-Green) containing the green-light-emitting nanocrystals, and the color layer (NC-Blue) optionally containing the blue-light-emitting nanocrystals in the light conversion layer 9 illustrated in FIG. 4 is the same as the embodiment illustrated in FIG. 1, and thus the description is omitted here. Although the red color layer portion, the green color layer portion, and the blue color layer portion are illustrated as being in contact with each other also in FIG. 4, a black matrix serving as a light-shielding layer may be disposed therebetween in order to prevent color mixing.

In the case where light having a main peak at or near 450 nm (light having a blue emission spectrum) is emitted from the electroluminescent layer 12, preferably, a colorant layer containing a blue colorant (i.e., a blue color filter) is disposed on one surface therebetween because the entry of unwanted light from the outside can be prevented to inhibit a deterioration in image quality. An example of a layer structure including the light conversion layer 9 having the two-layer structure and the blue color filter serving as essential elements is a structure illustrated in FIG. 5.

Figure 5:
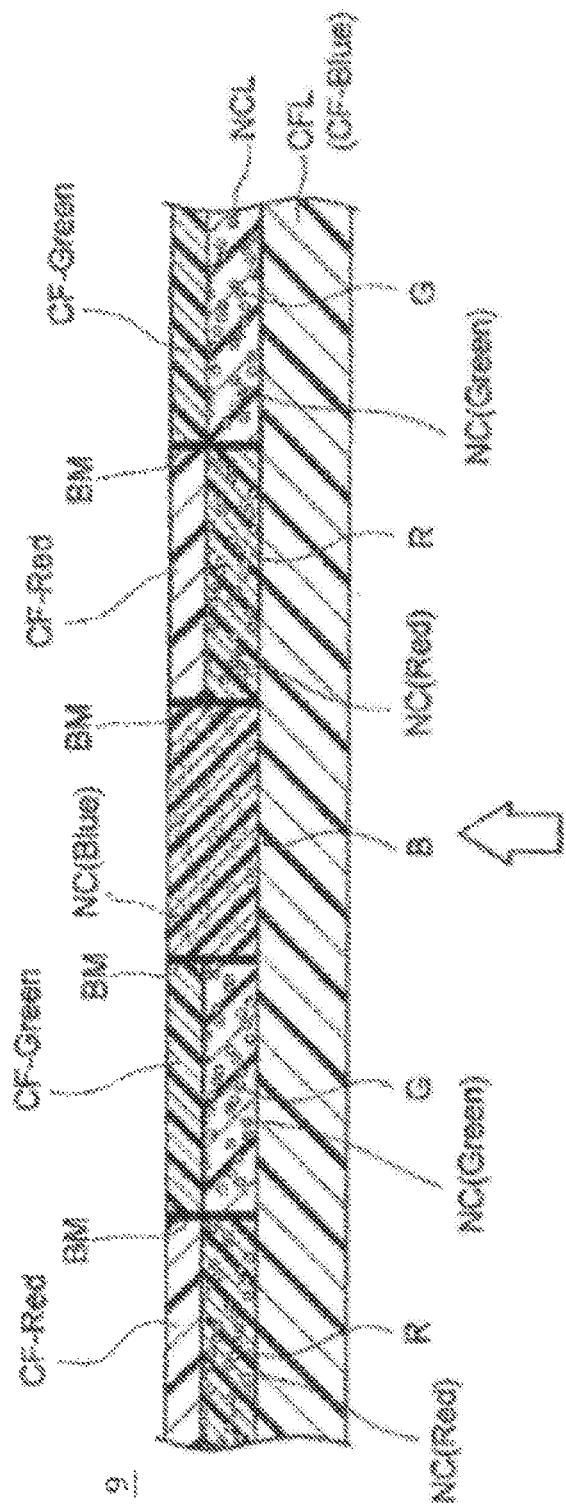
FIG. 5 is an enlarged schematic view illustrating another example of the light conversion layer according to the present invention.

FIG. 5 is an enlarged schematic view illustrating an example of the light conversion layer 9 according to the present invention. The light conversion layer 9 includes a red color layer R, a green color layer G, and a blue color layer B. The red (R) pixel portion R (red color layer R) includes a colorant layer (i.e., a red color filter) CF-Red containing a red colorant, a light conversion pixel layer (NC) containing a red-light-emitting nanocrystals, and a colorant layer CFL (blue color filter CF-Blue) containing a blue colorant. The green (G) pixel portion (green color layer G) includes a colorant layer (i.e., a green color filter) CF-Green containing a green colorant, a light conversion pixel layer (NC) containing a green-light-emitting nanocrystals, and a colorant layer CFL (blue color filter CF-Blue) containing a blue colorant. The blue (B) pixel portion (blue color layer B) includes a transparent rein layer and/or a color layer CFL (i.e., a blue color filter) containing a blue colorant, a layer (NC) optionally containing light-emitting nanocrystals, and a colorant layer CFL (blue color filter) containing a blue colorant. A black matrix serving as a light-shielding layer is disposed between the red color layer, the green color layer, and the blue color layer.

Accordingly, the light conversion layer 9 has a stack having a three-layer structure in which the (blue) color filter layer CFL, the layer (NCL) containing the light-emitting nanocrystals NC, and the red (R), green (G), or blue (B) color filter provided with the three-primary pixel of the red (R), green (G), or blue (B) are stacked in this order. However, the color filter layer CFL may be eliminated, as needed. In place of the colorant layer (i.e., green color filter) CF-Green containing the green colorant, a colorant layer (i.e., yellow color filter) containing a yellow colorant may be used for the purpose of color adjustment.

Each of the red color layer R, the green color layer G, and the blue color layer B may appropriately contain a colorant, as needed. The layer (NCL) containing the light-emitting nanocrystals NC may contain colorants corresponding to the colors.

In the above structure, a portion of light (excitation light, for example, blue light) from the electroluminescent layer 12, the portion having not been absorbed by the light-emitting nanocrystals, can be absorbed by the color filter of each color and the blue color filter layer CFL disposed on one surface. Thus, the remaining excitation light can be inhibited or prevented from passing through the light conversion layer. Also in FIG. 5, the blue color filter is disposed as a color filter layer CFL because light having a main peak at or near 450 nm (light having a blue emission spectrum) is assumed to be used as light from the electroluminescent layer 12. However, the color of the color filter layer is appropriately changed in accordance with the type of light source used.

Figure 6:
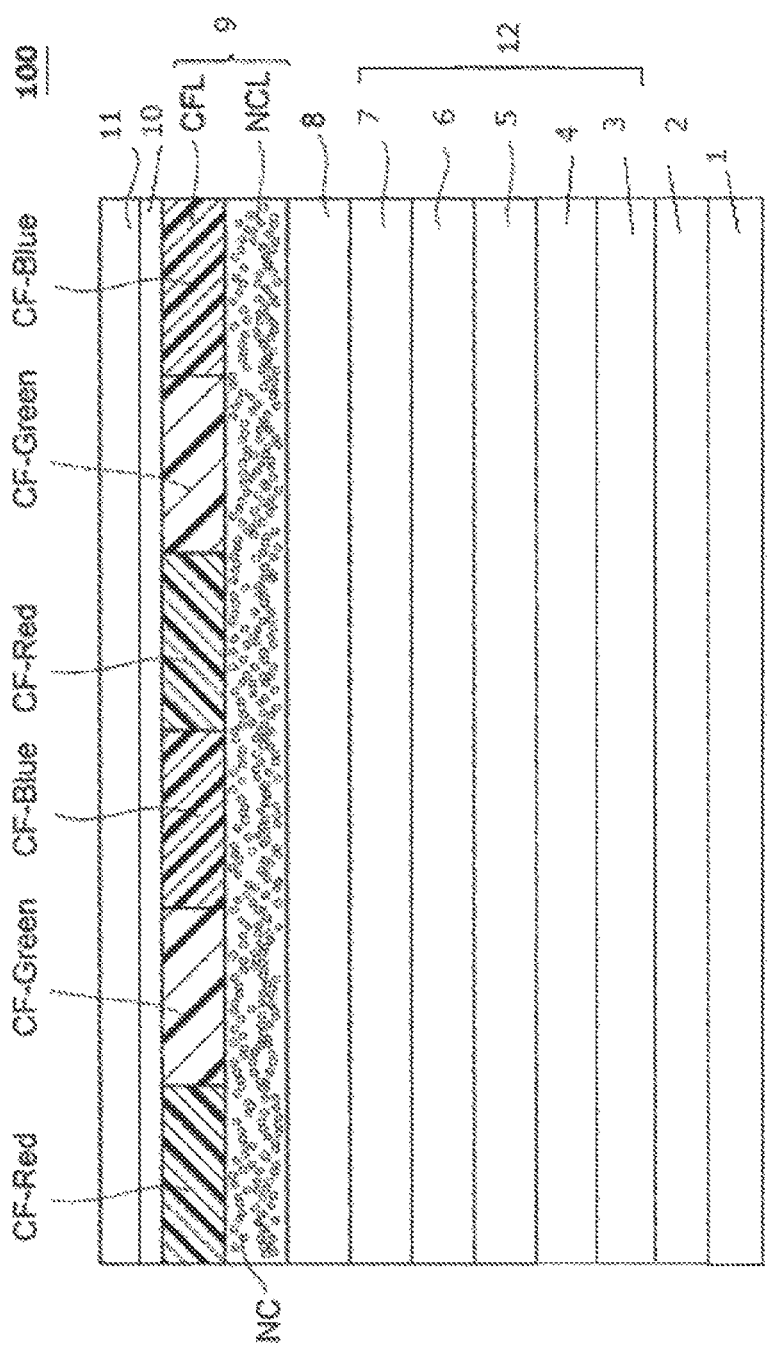
FIG. 6 is a schematic cross-sectional view illustrating a light-emitting device according to another embodiment of the present invention.

FIG. 6 is a schematic cross-sectional view illustrating the light-emitting device 100 according to another embodiment of the present invention. The structure according to the embodiment illustrated in FIG. 6 has the same structure as in FIG. 1, except for the light conversion layer 9; thus, the description is omitted here. The light conversion layer 9 according to the embodiment illustrated in FIG. 6 has two layers: a layer containing light-emitting nanocrystals and a color filter stacked. Specifically, in the light conversion layer 9, a red (R) pixel portion (red color layer portion) has a two-layer structure including a layer (NCL) containing a light-emitting nanocrystals and a colorant layer containing a red colorant, a green (G) pixel portion (green color layer portion) has a two-layer structure including the layer (NC) containing the light-emitting nanocrystals and a colorant layer containing a green colorant, and a blue (B) pixel portion (blue color layer portion) has a two-layer structure including the layer (NC) containing the light-emitting nanocrystals and a colorant layer containing a blue colorant.

In this case, the light-emitting nanocrystals in the layer containing the light-emitting nanocrystals NC preferably contain one or two selected from the group consisting of blue-light-emitting nanocrystals that absorb incident light (light from the light source, preferably blue light) to emit blue light, a green-light-emitting nanocrystals that absorb incident light (light from the light source, preferably blue light) to emit green light, and a red-light-emitting nanocrystals that absorb incident light (light from the light source, preferably blue light) to emit red light. Also in this embodiment, a black matrix may be disposed in order to prevent color mixing between the color layers.

Figure 7:
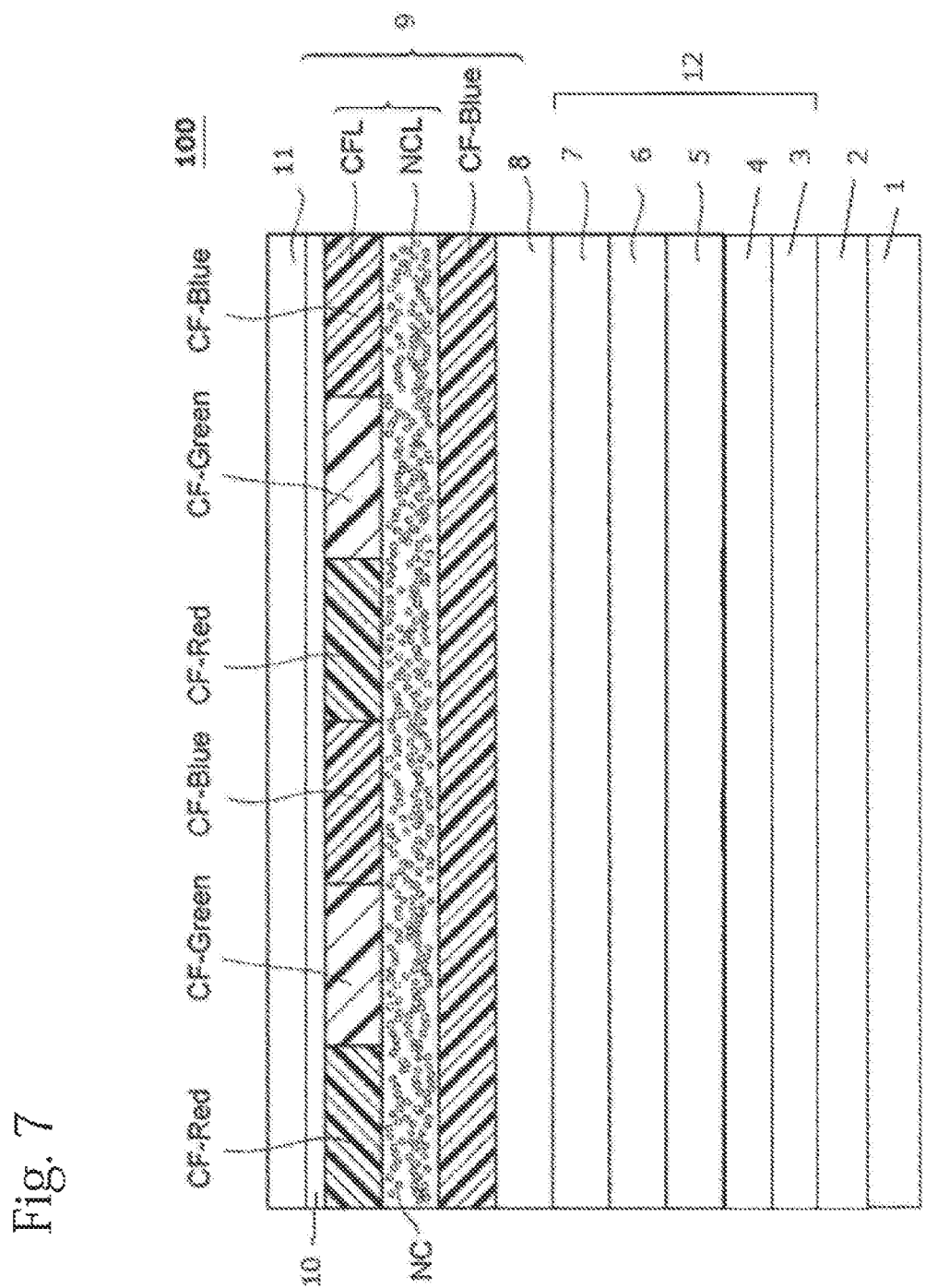
FIG. 7 is a schematic cross-sectional view illustrating a light-emitting device according to another embodiment of the present invention.

In the embodiment illustrated in FIG. 6, a blue color filter is preferably disposed on one surface of the light conversion layer 9 adjacent to the light-emitting layer because the entry of unwanted light can be prevented to inhibit a deterioration in image quality. FIG. 7 illustrates the structure of the light conversion layer 9 including the blue color filter according to a modified embodiment.

FIG. 7 is a schematic cross-sectional view illustrating the light-emitting device 100 according to another embodiment of the present invention. The embodiment illustrated in FIG. 7 differs from the embodiment illustrated in FIG. 6 in that the colorant layer (i.e., blue color filter) containing the blue colorant is disposed on one surface; thus, the description is omitted here.

The light conversion layer, the electron injection layer, the electron transport layer, the light-emitting layer, the hole transport layer, and the hole injection layer, which are main constituent elements of the light-emitting device according to the present invention, will be described in detail below.
"Light Conversion Layer"

The light conversion layer according to the present invention will be described in detail below. Regarding the constituent elements of each of the pixel portions of the light conversion layer, the pixel portion contains the light-emitting nanocrystal as an indispensable component and may contain a resin component and, if necessary, a molecule, a known additive, and another colorant having an affinity for the light-emitting nanocrystal. As described above, a black matrix is preferably disposed at boundary portions between the pixel layers in view of contrast.
(Light-Emitting Nanocrystal)

The light conversion layer according to the present invention contains the light-emitting nanocrystals. The term "nanocrystals" used in the present specification refers to particles each having at least one dimension with a length of, preferably, 100 nm or less. The nanocrystals may have any geometric shape and may be symmetrical or asymmetrical. Specific examples of the shape of the nanocrystals include long slender shapes, rod-like shapes, circular shapes (spherical shapes), elliptical shapes, pyramidal shapes, disc shapes, branched shapes, mesh-like shapes, and irregular shapes. In some embodiments, the nanocrystals are preferably quantum dots or quantum rods.

Each of the light-emitting nanocrystals preferably includes a core containing at least one first semiconductor material; and a shell covering the core and containing a second semiconductor material identical to or different from that of the core.

Thus, the light-emitting nanocrystal is formed of the core containing at least the first semiconductor material and the shell containing the second semiconductor material, and the first semiconductor material and the second semiconductor material may be the same or different. The core and/or shell may contain a third semiconductor material other than the first semiconductor and/or the second semiconductor. The expression "covering the core" used here indicates that at least part of the core may be covered.

Additionally, the light-emitting nanocrystal preferably includes a core containing at least one first semiconductor material, a first shell covering the core and containing a second semiconductor material identical to or different from that of the core, and, if necessary, a second shell covering the first shell and containing a third semiconductor material identical to or different from that of the first shell.

Accordingly, the light-emitting nanocrystal according to the present invention preferably has at least one of the three structures: a structure including a core containing a first semiconductor material and a shell covering the core and containing a second semiconductor material identical to the first semiconductor material, i.e., a structure composed of one or two or more semiconductor materials (=a structure consisting only of a core (also referred to as a "core structure")); a core-shell structure such as a structure including a core containing a first semiconductor material and a shell covering the core and containing a second semiconductor material different from that of the core; and a core-shell-core structure such as a structure including a core containing a first semiconductor material, a first shell covering the core and containing a semiconductor material different from that of the core, and a second shell covering the first shell and containing a third semiconductor material different from that of the first shell.

The light-emitting nanocrystal according to the present invention preferably has three structures: the core structure, the core-shell structure, and the core-shell-core structure, as described above. In this case, the core may be composed of a mixed crystal containing two or more semiconductor materials (for example, CdSe+CdS or CIS+ZnS). The shell may also be composed of a mixed crystal containing two or more semiconductor materials.

In the light conversion layer according to the present invention, the light-emitting nanocrystal may be in contact with a molecule (i.e., a ligand) having an affinity for the light-emitting nanocrystal.

The molecule having an affinity is a low-molecular-weight compound or a polymer having a functional group with an affinity for the light-emitting nanocrystal. The functional group having an affinity is not particularly limited and is preferably a group containing one element selected from the group consisting of nitrogen, oxygen, sulfur, and phosphorus. Examples thereof include organic sulfur groups, organic phosphorus groups, a pyrrolidone group, a pyridine group, an amino group, an amide group, an isocyanate group, a carbonyl group, and a hydroxy group.

The semiconductor material according to the present invention is preferably one or two or more selected from the group consisting of II-VI group semiconductors, III-V group semiconductors, I-III-VI group semiconductors, group IV semiconductors, and I-II-IV-VI group semiconductors. Preferred examples of the first semiconductor material, the second semiconductor material, and the third semiconductor material according to the present invention are the same as the semiconductor materials described above.

Specifically, the semiconductor material according to the present invention is at least one or more selected from the group consisting of CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, CdHgZnTe, CdZnSeS, CdZnSeTe, CdZnSTe, CdHgSeS, CdHgSeTe, CdHgSTe, HgZnSeS, HgZnSeTe, HgZnSTe; GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb; SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe; SiC, SiGe, AgInSe$_2$, CuGaSe$_2$, CuInS$_2$, CuGaS$_2$, CuInSe$_2$, AgInS$_2$, AgGaSe$_2$, AgGaS$_2$, C, Si, and Ge. These compound semiconductors may be used alone or in combination as a mixture of two or more. The semiconductor material according to the present invention is preferably at least one or more selected from the group consisting of CdS, CdSe, CdTe, ZnS, ZnSe, ZnTe, ZnO, HgS, HgSe, HgTe, InP, InAs, InSb, GaP, GaAs, GaSb, AgInS$_2$, AgInSe$_2$, AgInTe$_2$, AgGaS$_2$, AgGaSe$_2$, AgGaTe$_2$, CuInS$_2$, CuInSe$_2$, CuInTe$_2$, CuGaS$_2$, CuGaSe$_2$, CuGaTe$_2$, Si, C, Ge, and Cu$_2$ZnSnS$_4$. These compound semiconductors may be used alone or in combination as a mixture of two or more.

The light-emitting nanocrystals according to the present invention preferably contain at least one nanocrystal selected from the group consisting of red-light-emitting nanocrystals that emit red light, green-light-emitting nanocrystals that emit green light, and blue-light-emission nanocrystals that emit blue light. Typically, the emission color of the light-emitting nanocrystals depends on the particle size in accordance with the solution of the Schrödinger wave equation in a square-well potential model and also depends on the energy gap of the light-emitting nanocrystals. Thus, the emission color is selected by controlling the light-emitting nanocrystals used and the particle size thereof.

The upper limit of the peak wavelength of the fluorescence spectrum of the red-light-emitting nanocrystals that emit red light in the present invention is preferably 665 nm, 663 nm, 660 nm, 658 nm, 655 nm, 653 nm, 651 nm, 650 nm, 647 nm, 645 nm, 643 nm, 640 nm, 637 nm, 635 nm, 632 nm, or 630 nm. The lower limit of the peak wavelength is preferably 628 nm, 625 nm, 623 nm, 620 nm, 615 nm, 610 nm, 607 nm, or 605 nm.

The upper limit of the peak wavelength of the fluorescence spectrum of the green-light-emitting nanocrystals that emit green light in the present invention is preferably 560 nm, 557 nm, 555 nm, 550 nm, 547 nm, 545 nm, 543 nm, 540 nm, 537 nm, 535 nm, 532 nm, or 530 nm. The lower limit of the peak wavelength is preferably 528 nm, 525 nm, 523 nm, 520 nm, 515 nm, 510 nm, 507 nm, 505 nm, 503 nm, or 500 nm.

The upper limit of the peak wavelength of the fluorescence spectrum of the blue-light-emitting nanocrystals that emit blue light in the present invention is preferably 480 nm, 477 nm, 475 nm, 470 nm, 467 nm, 465 nm, 463 nm, 460 nm, 457 nm, 455 nm, 452 nm, or 450 nm. The lower limit of the peak wavelength is preferably 450 nm, 445 nm, 440 nm, 435 nm, 430 nm, 428 nm, 425 nm, 422 nm, or 420 nm.

A semiconductor material used for the red-light-emitting nanocrystals that emit red light in the present invention preferably has a peak emission wavelength of 635 nm±30 nm. A semiconductor material used for the green-light-emitting nanocrystals that emit green light preferably has a peak emission wavelength of 530 nm±30 nm. A semiconductor material used for the blue-light-emission nanocrystals that emit blue light preferably has a peak emission wavelength of 450 nm±30 nm.

The lower limit of the fluorescence quantum yield of the light-emitting nanocrystals according to the present invention, in order of preference, is 40% or more, 30% or more, 20% or more, and 10% or more.

The upper limit of the full width at half maximum of the fluorescence spectrum of the light-emitting nanocrystals according to the present invention, in order of preference, is 60 nm or less, 55 nm or less, 50 nm or less, and 45 nm or less.

The upper limit of the particle size (primary particles) of the red-light-emitting nanocrystals according to the present invention, in order of preference, is 50 nm or less, 40 nm or less, 30 nm or less, and 20 nm or less.

The upper limit of the peak wavelength of the red-light-emitting nanocrystals according to the present invention is 665 nm, and the lower limit thereof is 605 nm. A compound and its particle size are selected so as to obtain the peak wavelength. The upper limit of the peak wavelength of the green-light-emitting nanocrystals is 560 nm, and the lower limit thereof is 500 nm. The upper limit of the peak wavelength of the blue-light-emission nanocrystals is 420 nm, and the lower limit thereof is 480 nm. Compounds and the particle size thereof are selected so as to obtain the peak wavelengths.

The light-emitting device or the image display apparatus according to the present invention includes at least one pixel. The color of the pixel is obtained by three adjacent pixels. The pixels contain different nanocrystals that emit colors of light: red (for example, light-emitting nanocrystals composed of CdSe, rod-like light-emitting nanocrystals composed of CdSe, rod-like light-emitting nanocrystals having a core-shell structure in which the shell portion is composed of CdS and the inner core portion is composed of CdSe, rod-like light-emitting nanocrystals having a core-shell structure in which the shell portion is composed of CdS and the inner core portion is composed of ZnSe, light-emitting nanocrystals having a core-shell structure in which the shell portion is composed of CdS and the inner core portion is composed of CdSe, light-emitting nanocrystals having a core-shell structure in which the shell portion is composed of CdS and the inner core portion is composed of ZnSe, light-emitting nanocrystals composed of a mixed crystal of CdSe and ZnS, rod-like light-emitting nanocrystals composed of a mixed crystal of CdSe and ZnS, light-emitting nanocrystals composed of InP, rod-like light-emitting nanocrystals composed of InP, light-emitting nanocrystals composed of a mixed crystal of CdSe, rod-like light-emitting nanocrystals composed of a mixed crystal of CdSe and CdS, light-emitting nanocrystals composed of a mixed crystal of ZnSe and CdS, or rod-like light-emitting nanocrystals composed of a mixed crystal of ZnSe and CdS); green (light-emitting nanocrystals composed of CdSe, rod-like light-emitting nanocrystals composed of CdSe, light-emitting nanocrystals composed of a mixed crystal of CdSe and ZnS, or rod-like light-emitting nanocrystals composed of a mixed crystal of CdSe and ZnS); and blue (light-emitting nanocrystals composed of ZnSe, rod-like light-emitting nanocrystals composed of ZnSe, light-emitting nanocrystals composed of ZnS, rod-like light-emitting nanocrystals composed of ZnS, light-emitting nanocrystals having a core-shell structure in which the shell portion is composed of ZnSe and the inner core portion is composed of ZnS, rod-like light-emitting nanocrystals having a core-shell structure in which the shell portion is composed of ZnSe and the inner core portion is composed of ZnS, light-emitting nanocrystals composed of CdS, or rod-like light-emitting nanocrystals composed of CdS). The light conversion layer may contain another color (for example, yellow), as needed. Furthermore, different colors obtained from adjacent four or more pixels may also be used.

The average particle size (primary particles) of the light-emitting nanocrystals according to the present invention in this specification can be measured by TEM observation. Typical examples of a method for measuring the average particle size of nanocrystals include a light scattering method, a particle size measurement method by sedimentation with a solvent, and a method in which particles are directly observed with an electron microscope and average particle size is actually measured. The light-emitting nanocrystals are easily degraded by, for example, water. In the present invention, thus, a method is preferred in which freely-selected multiple crystals are directly observed with a transmission electron microscope (TEM) or scanning electron microscope (SEM), the particle sizes of the particles are calculated from the ratio of the length of the major axis to the length of the minor axis in a two-dimensional projection image, and the average thereof is determined. In the present invention, thus, the average particle size is calculated by the method. The term "primary particles" of the light-emitting nanocrystals refers to single crystals having a size of several to several tens of nanometers or crystallites similar thereto. The size and shape of the primary particles of the light-emitting nanocrystals seems to depend on, for example, the chemical composition, structure, production method, and production conditions of the primary particles.

The light conversion layer in the present invention preferably contains a resin component that appropriately disperses and stabilizes the light-emitting nanocrystals in addition to the light-emitting nanocrystals.

The resin component is preferably an alkali-developable polymer derived from a photopolymerizable compound because the light conversion layer is produced mainly by a photolithography method. Specific examples thereof include polymers derived from bifunctional monomers such as 1,6-hexanediol diacrylate, ethylene glycol diacrylate, neopentyl glycol diacrylate, triethylene glycol diacrylate, bis(acryloxyethoxy)bisphenol A, and 3-methylpentanediol diacrylate; polymers derived from relatively-low-molecular-weight multifunctional monomers such as trimethylolpropane triacrylate, pentaerythritol triacrylate, tris[2-(meth)acryloyloxyethyl]isocyanurate, dipentaerythritol hexaacrylate, and dipentaerythritol pentaacrylate; and polymers derived from relatively-large-molecular-weight multifunctional monomers such as polyester acrylate, polyurethane acrylate, and polyether acrylate.

A thermoplastic resin may be partially used in combination with the polymer. Examples of the thermoplastic resin include urethane-based resins, acrylic resins, polyamide-based resins, polyimide-based resins, styrene-maleic acid-based resins, and styrene-maleic anhydride resins.

If necessary, the light conversion layer according to the present invention may further contain known additives such as a polymerization initiator, a catalyst, and a scattering agent, e.g., alumina, silica, titanium oxide beads, zeolite, or zirconia, in addition to the transparent resin and the light-emitting nanocrystals.

(Colorant)

The light conversion layer according to the present invention includes pixel portions of three colors of red (R), green (G), and blue (B) and, if necessary, may contain a colorant. As the colorant, a known colorant may be used. For example, preferably, the red (R) pixel portion contains a diketopyrrolopyrrole pigment and/or an anionic red organic dye, the green (G) pixel portion contains at least one selected from the group consisting of halogenated copper phthalocyanine pigments, phthalocyanine-based green dyes, and mixtures of phthalocyanine-based blue dyes and azo-based yellow organic dyes, and the blue (B) pixel portion contains an B-type copper phthalocyanine pigment and/or a cationic blue organic dye.

A preferred colorant optionally added, together with the light-emitting nanocrystals, in the red color layer according to the present invention preferably contains a diketopyrrolopyrrole pigment and/or an anionic red organic dye. As the diketopyrrolopyrrole pigment, specifically, one or two or more selected from C.I. Pigment Red 254, 255, 264, and 272 and Orange 71 and 73 are preferred. One or two or more selected from Red 254, 255, 264, and 272 are more preferred. C.I. Pigment Red 254 is particularly preferred. As the anionic red organic dye, specifically, one or two or more selected from C.I. Solvent Red 124 and Acid Red 52 and 289 are preferred. C.I. Solvent Red 124 is particularly preferred.

Preferably, the red color layer according to the present invention further contains, as a colorant, at least one organic dye or pigment selected from the group consisting of C.I. Pigment Red 177, 242, 166, 167, and 179, C.I. Pigment Orange 38 and 71, C.I. Pigment Yellow 150, 215, 185, 138, and 139, C.I. Solvent Red 89, C.I. Solvent Orange 56, C.I. Solvent Yellow 21, 82, 83:1, 33, and 162.

A preferred colorant optionally added, together with the light-emitting nanocrystals, in the green color layer according to the present invention preferably contains at least one selected from the group consisting of halogenated metal phthalocyanine pigments, phthalocyanine-based green dyes, and mixtures of phthalocyanine-based blue dyes and azo-based yellow organic dyes. As the halogenated metal phthalocyanine pigments, the following two groups of halogenated metal phthalocyanine pigments are exemplified.

(First Group)

Halogenated metal phthalocyanine pigments each containing, as a central metal, a metal selected from the group consisting of Al, Si, Sc, Ti, V, Mg, Fe, Co, Ni, Zn, Ga, Ge, Y, Zr, Nb, In, Sn, and Pb, 8 to 16 halogen atoms per phthalocyanine molecule being bonded to the benzene rings of the phthalocyanine molecule, in which when the central metal is trivalent, any of one halogen atom, a hydroxy group, and a sulfonic group ($—SO_3H$) is bonded to the central metal and in which when the central metal is a tetravalent metal, any of one oxygen atom, two halogen atoms that may be the same or different, a hydroxy group, and a sulfonic group is bonded to the central metal.

(Second Group)

Pigments composed of halogenated metal phthalocyanine dimers each having a structural unit containing two halogenated metal phthalocyanine molecules having central metals composed of trivalent metals each selected from the group consisting of Al, Sc, Ga, Y, and In, 8 to 16 halogen atoms per phthalocyanine molecule being bonded to the benzene rings of the phthalocyanine molecule, the central metals of the structural unit being bonded to each other with a divalent atomic group selected from the group consisting of an oxygen atom, a sulfur atom, sulfinyl (—SO—), and sulfonyl (—$SO_2$—) provided therebetween.

In the halogenated metal phthalocyanine pigment used in the present invention, the halogen atoms bonded to the benzene rings may be all the same or different. Different halogen atoms may be bonded to one benzene ring.

The halogenated metal phthalocyanine pigment, in which 9 to 15 bromine atoms among 8 to 16 halogen atoms per phthalocyanine molecule are bonded to the benzene rings of the phthalocyanine molecule, used in the present invention appears light yellowish green and is most suitable for use in the green pixel portion of the color filter. The halogenated metal phthalocyanine used in the present invention is insoluble or poorly soluble in water and organic solvents. Pigments that are not subjected to finishing treatment (also referred to as "crude pigments") and pigments that are subjected to finishing treatment are also included in the halogenated metal phthalocyanine used in the present invention.

The halogenated metal phthalocyanine pigments belonging to the first and second groups can be represented by general formula (PIG-1):

[Chem. 1]

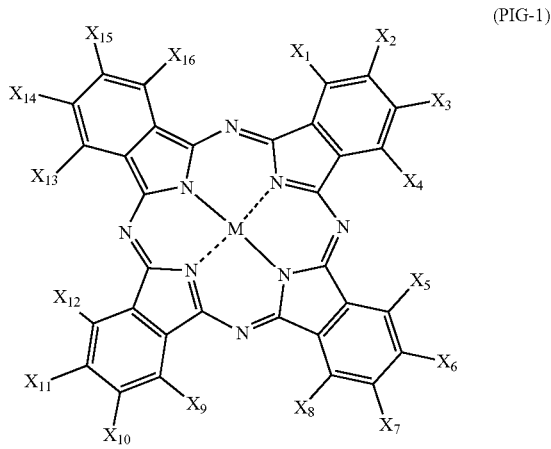

(PIG-1)

The halogenated metal phthalocyanine pigments belonging to the first group and represented by general formula (PIG-1) are described below.

In general formula (PIG-1), $X_1$ to $X_{16}$ each represent a hydrogen atom, a chlorine atom, a bromine atom, or an iodine atom. Four X atoms bonded to one benzene ring may be the same or different. Among $X_1$ to $X_{16}$ bonded to four benzene rings, 8 to 16 atoms are each a chlorine atom, a bromine atom, or an iodine atom. M represents a center metal. In the halogenated metal phthalocyanine pigments having the same Y described below and the same number m thereof, a pigment in which the total of chlorine atoms, bromine atoms, and iodine atoms in 16 $X_1$ to $X_{16}$ is less than 8 is blue. Similarly, in a pigment in which the total of chlorine atoms, bromine atoms, and iodine atoms in 16 $X_1$ to $X_{16}$ is 8 or more, yellow is deeper as the total value is larger. Y bonded to the central metal M is a monovalent atomic group selected from the group consisting of a halogen atom of fluorine, chlorine, bromine, or iodine, an oxygen atom, a hydroxy group, and a sulfonic group, and m is the number of Y bonded to the central metal M and is an integer of 0 to 2.

The value of m is determined in accordance with the valence of the central metal M. In the case where the central metal M is a trivalent metal such as Al, Sc, Ga, Y, or In, m=1, and one group selected from the group consisting of fluorine, chlorine, bromine, iodine, a hydroxy group, and a sulfonic group is bonded to the central metal. In the case where the central metal M is a tetravalent metal such as Si, Ti, V, Ge, Zr, or Sn, m=2. In this case, one oxygen atom is bonded to the central metal, or two groups selected from the group consisting of fluorine, chlorine, bromine, iodine, a hydroxy group, and a sulfonic group are bonded to the central metal. In the case where the central metal M is a divalent metal such as Mg, Fe, Co, Ni, Zn, Zr, Sn, or Pb, Y is not present.

The halogenated metal phthalocyanine pigments belonging to the second group and represented by general formula (PIG-1) are described below.

In general formula (PIG-1), $X_1$ to $X_{16}$ are as defined above. The central metal M is a trivalent metal selected from the group consisting of Al, Sc, Ga, Y, and In, and m is 1. Y represents an atomic group illustrated below.

[Chem. 2]

Y =
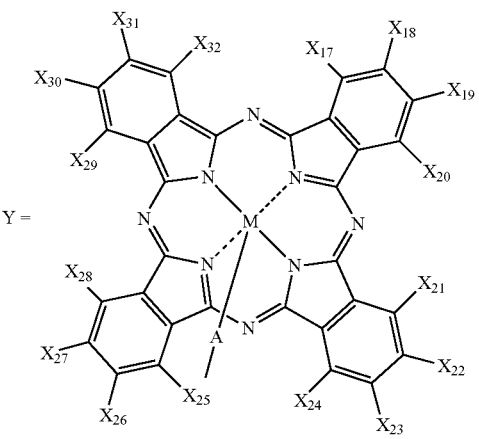

In the chemical structure of the atomic group Y, the central metal M is as defined above. $X_{17}$ to $X_{32}$ are as defined for $X_1$ to $X_{16}$ in general formula (PIG-1). A is a divalent atomic group selected from the group consisting of an oxygen atom, a sulfur atom, sulfinyl (—SO—), and sulfonyl (—SO$_2$—). M in general formula (PIG-1) is bonded to M in the atomic group Y with the divalent atomic group A provided therebetween.

The halogenated metal phthalocyanine pigments belonging to the second group are halogenated metal phthalocyanine dimers each having a structural unit containing two halogenated metal phthalocyanine molecules that are bonded to each other with the divalent atomic group provided therebetween.

Specific examples of the halogenated metal phthalocyanine pigments represented by general formula (PIG-1) include the following items (1) to (4).

(1) Halogenated metal phthalocyanine pigments such as halogenated tin phthalocyanine pigments, halogenated nickel phthalocyanine pigments, and halogenated zinc phthalocyanine pigments, each of the halogenated metal phthalocyanine pigments containing, as a central metal, a divalent metal selected from the group consisting of Mg, Fe, Co, Ni, Zn, Zr, Sn, and Pb, 8 to 16 halogen atoms being bonded to four benzene rings per phthalocyanine molecule. Among these, a chlorinated brominated zinc phthalocyanine pigment is C.I. Pigment Green 58, which is particularly preferred.

(2) Halogenated metal phthalocyanine pigments such as halogenated chloroaluminum phthalocyanines, each of the halogenated metal phthalocyanine pigments containing, as a central metal, a trivalent metal selected from the group consisting of Al, Sc, Ga, Y, and In, the central metal being bonded to one halogen atom, a hydroxy group, or a sulfonic group, 8 to 16 halogen atoms being bonded to four benzene rings per phthalocyanine molecule.

(3) Halogenated metal phthalocyanine pigments such as halogenated oxytitanium phthalocyanines and halogenated oxyvanadium phthalocyanine, each of the halogenated metal phthalocyanine pigments containing, as a central metal, a tetravalent metal selected from the group consisting of Si, Ti, V, Ge, Zr, and Sn, the central metal being bonded to one oxygen atom, two halogen atoms that may be the same or different, a hydroxy group, or a sulfonic group, 8 to 16 halogen atoms being bonded to four benzene rings per phthalocyanine molecule.

(4) Pigments composed of halogenated metal phthalocyanine dimers such as halogenated μ-oxo-aluminum phthalocyanines and halogenated μ-thio-aluminum phthalocyanine dimers, each of the halogenated metal phthalocyanine dimers each having a structural unit containing two halogenated metal phthalocyanine molecules having central metals composed of trivalent metals each selected from the group consisting of Al, Sc, Ga, Y, and In, 8 to 16 halogen atoms being bonded to four benzene rings per phthalocyanine molecule, the central metals of the structural unit being bonded to each other with a divalent atomic group selected from the group consisting of an oxygen atom, a sulfur atom, sulfinyl, and sulfonyl (—SO$_2$—) provided therebetween.

Regarding other colorants, preferably, a mixture of C.I. Solvent Blue 67 and C.I. Solvent Yellow 162, or C.I. Pigment Green 7 and/or 36 is optionally contained in the green color layer.

Preferably, the green color layer according to the present invention further contains, as a colorant, at least one organic dye or pigment selected from the group consisting of C.I. Pigment Yellow 150, 215, 185, and 138 and C.I. Solvent Yellow 21, 82, 83:1, and 33.

A preferred colorant optionally added, together with the light-emitting nanocrystals, in the blue color layer according to the present invention preferably contains an ε-type copper phthalocyanine pigment and/or a cationic blue organic dye. The ε-type copper phthalocyanine pigment is C.I. Pigment Blue 15:6. Specifically, the cationic blue organic dye is preferably C.I. Solvent Blue 2, 3, 4, 5, 6, 7, 23, 43, 72, and 124, and C.I. Basic Blue 7 and 26, more preferably C.I. Solvent Blue 7 and Basic Blue 7, particularly preferably C.I. Solvent Blue 7.

Preferably, the blue color layer according to the present invention further contains, as a colorant, at least one organic dye or pigment selected from the group consisting of C.I. Pigment Blue 1, C.I. Pigment Violet 23, C.I. Basic Blue 7, C.I. Basic Violet 10, C.I. Acid Blue 1, 90, and 83, and C.I. Direct Blue 86.

In the case where the light conversion layer according to the present invention contains a yellow (Y) pixel portion (yellow color layer), the yellow color layer preferably contains, as a colorant, at least one yellow organic dye or pigment selected from the group consisting of C.I. Pigment Yellow 150, 215, 185, 138, and 139, C.I. Solvent Yellow 21, 82, 83:1, 33, and 162.

In the light conversion layer according to the present invention, the upper limit of the light-emitting nanocrystal content with respect to the transparent resin is preferably 80 parts by mass, 70 parts by mass, 60 parts by mass, or 50 parts by mass based on 100 parts by mass of the transparent resin. The lower limit of the light-emitting nanocrystal content is preferably 1.0 part by mass, 3.0 parts by mass, 5.0 parts by mass, or 10.0 parts by mass based on 100 parts by mass of the transparent resin. In the case where multiple types of light-emitting nanocrystals are contained in the light conversion layer, the content described above indicates the total content.

(Color Filter)

The light conversion layer according to the present invention is preferably formed of a stack in which a layer (NC) containing the light-emitting nanocrystals and a color filter are stacked (for example, FIG. 10). Specifically, the light conversion layer preferably includes a red color layer R, a green color layer G, and a blue color layer B. In this case, the red (R) pixel portion R (red color layer portion R) preferably includes a layer (NC) containing red-light-emitting nanocrystals and a colorant layer (CF-Red) containing a red colorant. The green (R) pixel portion (green color layer portion G) preferably includes a layer (NC) containing green-light-emitting nanocrystals and a colorant layer (CF-Green) containing a green colorant or a colorant layer (yellow color layer) containing a yellow colorant. The blue (R) pixel portion (blue color layer portion B) preferably include a colorant layer (CF-Blue, blue colorant-containing layer) containing a blue colorant and/or a transparent resin layer and, if necessary, a layer (NC) containing blue-light-emitting nanocrystals. In the present invention, a colorant-containing color filter such as the colorant layer (CF-Green or CF-Red) stacked on the light conversion pixel layer illustrated in FIGS. 4 to 7, the color filter (CFL) illustrated in FIGS. 5 to 7, or the blue color filter (CF-Blue) illustrated in FIGS. 3, 5, and so forth may be appropriately used.

The color filter is preferably formed with the colorant. For example, preferably, the red (R) color filter contains a diketopyrrolopyrrole pigment and/or an anionic red organic dye, the green (G) color filter contains at least one selected from the group consisting of halogenated copper phthalocyanine pigments, phthalocyanine-based green dyes, and mixtures of phthalocyanine-based blue dyes and azo-based yellow organic dyes, and the blue (B) color filter contains an B-type copper phthalocyanine pigment and/or a cationic blue organic dye.

The color filter may contain, for example, the transparent resin, a photocurable compound, and a dispersant, as needed. Regarding a method for producing the color filter, the color filter may be formed by, for example, a known photolithography method.

(Method for Producing Light Conversion Layer)

The light conversion layer may be formed by a known method. A typical method for forming a pixel portion is a photolithography method, which is described as follows: A photocurable composition containing light-emitting nanocrystals described below is applied to a surface of a conventional color filter transparent substrate on which a black matrix is disposed. After drying by heating (prebaking), pattern exposure is performed by irradiation with ultraviolet radiation using a photomask. After a photocurable compound disposed at a position corresponding to a pixel portion is cured, an unexposed portion is developed with a developer. A non-pixel portion is removed, and the pixel portion is fixed to the transparent substrate. In this method, a pixel portion composed of the cured colored film of the photocurable composition containing the light-emitting nanocrystals is formed on the transparent substrate.

Photocurable compositions described below are prepared for red (R) pixels, green (G) pixels, blue (B) pixels, and, if necessary, other color pixels such as yellow (Y) pixels. The above operation can be repeated to produce a light conversion layer having a color pixel portion including the red (R) pixels, the green (G) pixels, the blue (B) pixels, and the yellow (Y) pixels located at predetermined positions.

Examples of a method for applying the photocurable composition containing the light-emitting nanocrystals described below to a transparent substrate such as glass include a spin coating method, a roll coating method, and an inkjet method.

The drying conditions of the film of the photocurable composition containing the light-emitting nanocrystals applied to the transparent substrate vary depending on, for example, the type of component and the mixing ratio and are usually at about 50° C. to about 150° C. for about 1 to about 15 minutes. As light used for the photocuring of the photocurable composition containing the light-emitting nanocrystals, ultraviolet radiation or visible light in a wavelength range of 200 to 500 nm is preferably used. Various light sources that emit light in the wavelength range can be used.

Examples of the developing method include a liquid deposition method, a dipping method, and a spray method. After exposing and developing the photocurable composition, a transparent substrate on which a required color pixel portion is formed is washed with water and dried. The resulting color filter is subjected to heat treatment (post baking) with a heating device such as a hot plate or an oven at 90° C. to 280° C. for a predetermined time. This removes a volatile component in the colored coating film and allows the unreacted photocurable compound remaining in the photocurable composition containing the light-emitting nanocrystals to be thermally cured, thereby completing the light conversion layer.

The colorant for the light conversion layer and the resin of the present invention are used together with the light-emitting nanocrystals of the present invention to prevent deterioration and an increase in ion density (ID) due to blue light or ultraviolet light, thus enabling an image display apparatus to solve display defects such as voids to be provided.

A typical method for producing the photocurable composition containing the light-emitting nanocrystals is as follows: The light-emitting nanocrystals and an organic solvent are mixed together. Molecules having an affinity thereto, a dispersant, and a colorant (=a dye and/or pigment composition) are added thereto, as needed. The mixture is stirred and dispersed so as to be uniform, thereby preparing a dispersion for the formation of the pixel portion of the light conversion layer. A photocurable compound and, if necessary, a thermoplastic resin, a photopolymerization initiator, and so forth are added thereto, thereby preparing a light-emitting-nanocrystal-containing photocurable composition containing the light-emitting nanocrystals.

Examples of the organic solvent used here include aromatic solvents such as toluene, xylene, and methoxybenzene; acetate-based solvents such as ethyl acetate, propyl acetate, butyl acetate, propylene glycol monomethyl ether acetate, propylene glycol monoethyl ether acetate, diethylene glycol methyl ether acetate, diethylene glycol ethyl ether acetate, diethylene glycol propyl ether acetate, and diethylene glycol butyl ether acetate; propionate-based solvents such as ethoxyethyl propionate; alcoholic solvents such as methanol and ethanol; ether-based solvents such as butyl cellosolve, propylene glycol monomethyl ether, diethylene glycol ethyl ether, and diethylene glycol dimethyl ether; ketone-based solvents such as methyl ethyl ketone, methyl isobutyl ketone, and cyclohexanone; aliphatic hydrocarbon-based solvents such as hexane; nitrogen compound-based solvents such as N,N-dimethylformamide, γ-butyrolactam, N-methyl-2-pyrrolidone, aniline, and pyridine; lactone-based solvent such as γ-butyrolactone; and carbamates such as a methyl carbamate-ethyl carbamate (48:52) mixture.

Examples of the dispersant used here include dispersants such as DISPERBYK 130, DISPERBYK 161, DISPERBYK 162, DISPERBYK 163, DISPERBYK 170, DISPERBYK 171, DISPERBYK 174, DISPERBYK 180, DISPERBYK 182, DISPERBYK 183, DISPERBYK 184, DISPERBYK 185, DISPERBYK 2000, DISPERBYK 2001, DISPERBYK 2020, DISPERBYK 2050, DISPERBYK 2070, DISPERBYK 2096, DISPERBYK 2150, DISPERBYK LPN21116, and DISPERBYK LPN6919, available from BYK Chemie, Efka 46, Efka 47, Efka 452, Efka LP4008, Efka 4009, Efka LP4010, Efka LP4050, LP4055, Efka 400, Efka 401, Efka 402, Efka 403, Efka 450, Efka 451, Efka 453, Efka 4540, Efka 4550, Efka LP4560, Efka 120, Efka 150, Efka 1501, Efka 1502, and Efka 1503, available from Efka, Solsperse 3000, Solsperse 9000, Solsperse 13240, Solsperse 13650, Solsperse 13940, Solsperse 17000, 18000, Solsperse 20000, Solsperse 21000, Solsperse 20000, Solsperse 24000, Solsperse 26000, Solsperse 27000, Solsperse 28000, Solsperse 32000, Solsperse 36000, Solsperse 37000, Solsperse 38000, Solsperse 41000, Solsperse 42000, Solsperse 43000, Solsperse 46000, Solsperse 54000, and Solsperse 71000, available from Lubrizol Corporation, Ajisper PB711, Ajisper PB821, Ajisper PB822, Ajisper PB814, Ajisper PN411, and Ajisper PA111, available from Ajinomoto Co., Inc., acrylic resins, urethane-based resins, alkyd-based resins, natural rosin such as wood rosin, gum rosin, and tall rosin, modified rosin such as polymerized rosin, disproportionated rosin, hydrogenated rosin, oxidized rosin, and maleated rosin, rosin derivatives such as rosin amines, limed rosin, alkylene oxide adducts of rosin, alkyd adducts of rosin, and rosin-modified phenol, which are water-insoluble liquid synthetic resins at room temperature that may be contained. The addition of the dispersant and the resin contributes to the inhibition of flocculation, an improvement in the dispersion stability of a pigment, and an improvement in the viscosity properties of a dispersion.

An organic pigment derivative may also be contained as a dispersion aid. Examples thereof include phthalimidomethyl derivatives, sulfonic derivatives, N-(dialkylamino) methyl derivatives, and N-(dialkylaminoalkyl)sulfonic acid amide derivatives. Two or more different types of these derivatives may be used in combination.

Examples of a thermoplastic resin used for the preparation of a photocurable composition containing the light-emitting nanocrystals include urethane-based resins, acrylic resins, polyamide-based resins, polyimide-based resins, styrene-maleic acid resins, and styrene-maleic anhydride resins.

Examples of the photocurable compound in the light-emitting nanocrystals containing photocurable composition include bifunctional monomers such as 1,6-hexanediol diacrylate, ethylene glycol diacrylate, neopentyl glycol diacrylate, triethylene glycol diacrylate, bis(acryloxyethoxy)bisphenol A, and 3-methylpentanediol diacrylate; multifunctional monomers having relatively small molecular weights, such as trimethylolpropane triacrylate, pentaerythritol triacrylate, tris[2-(meth)acryloyloxyethyl)isocyanurate, dipentaerythritol hexaacrylate, and dipentaerythritol pentaacrylate; and multifunctional monomers having relatively large molecular weights, such as polyester acrylate, polyurethane acrylate, and polyether acrylate.

Examples of the photopolymerization initiator include acetophenone, benzophenone, benzyldimethylketal, benzoyl peroxide, 2-chlorothioxanthone, 1,3-bis(4'-azidobenzal)-2-propane, 1,3-bis(4'-azidobenzal)-2-propane-2'-sulfonic acid, and 4,4'-diazidostilbene-2,2'-disulfonic acid. Examples of a commercially available photopolymerization initiator include Irgacure (trade name)-184, Irgacure (trade name)-369 available from BASF, Darocur (trade name)-1173, and Lucirin-TPO available from BASF; Kayacure (trade name) DETX and Kayacure (trade name) OA, available from Nippon Kayaku Co., Ltd.; Vicure 10 and Vicure 55 available from Stauffer; Trigonal PI available from Akzo; Sandoray 1000 available from Sandoz; Deap available from The Upjohn Company; and Biimidazole available from Kurogane Kasei Co., Ltd.

A known photosensitizer may be used in combination with the photopolymerization initiator. Examples of the photosensitizer include amines, ureas, compounds containing sulfur atoms, compounds containing phosphorus atoms, compounds containing chlorine atoms, nitriles, and other compounds containing nitrogen atoms. These may be used alone or in combination of two or more.

The photopolymerization initiator content is not particularly limited and is, by mass, preferably in the range of 0.1% to 30% based on a compound having a photopolymerizable or photocurable functional group. At less than 0.1%, the sensitivity during photo-curing tends to decrease. At more than 30%, when a coating film composed of a resist containing a pigment dispersed is dried, the crystals of the photopolymerization initiator can precipitate to degrade the physical properties of the coating film.

The materials as described above are used. On a mass basis, 300 to 100,000 parts of an organic solvent and 1 to 500 parts of molecules or a dispersant having an affinity based on 100 parts of the light-emitting nanocrystals of the present invention are stirred and dispersed uniformly, thereby preparing a dispersion. Then 0.125 to 2,500 parts of the total of a thermoplastic resin and a photocurable compound based on 100 parts of the pigment dispersion, 0.05 to 10 parts of a photopolymerization initiator based on 1 part of the photocurable compound, and, if necessary, an organic solvent are stirred and dispersed uniformly, thereby enabling a photocurable composition containing the light-emitting nanocrystals to be prepared for the formation of a pixel portion.

A known organic solvent or aqueous alkali solution may be used as a developer. In particular, in the case where the photocurable composition contains a thermoplastic resin or a photocurable compound and where at least one of them has an acid value or is soluble in alkali, washing with an aqueous alkali solution is effective in forming a color filter pixel portion.

The method for producing the color pixel portions including the R pixels, the G pixels, the B pixels, and the Y pixels by the photolithography method has been described in detail. Regarding the pixel portions formed from the composition containing the light-emitting nanocrystals according to the present invention, the color pixel portions may be formed by another method such as an electrodeposition method, a transfer method, a micelle electrolytic method, a photovoltaic electrodeposition (PVED) method, an inkjet method, a reverse printing method, or a thermal curing method to produce a light conversion layer.

"Electron Injection Layer"

As a material used for the electron injection layer according to the present invention, a material having a low work function can be used. Examples thereof include alkali metals such as lithium and cesium, their oxides, their halides, and their carbonates, alkaline-earth metals such as calcium, their oxides, their halides, and their carbonates, Lewis bases such as magnesium silver and magnesium oxide, and lithium-aluminum alloys. It is believed that these materials can reduce a potential barrier formed during electron injection from one electrode. As a material used for the electron transport layer, a composite material having an electron-donating ability (donor) may be used. Examples of the electron-donating material include alkali-metal compounds such as lithium fluoride (LiF), cesium fluoride (CsF), calcium fluoride ($CaF_2$), and lithium oxide (LiOx), alkaline-earth metal compounds, rare-earth metal compounds such as erbium fluoride ($ErF_3$).

A composite material containing a mixture of an organic compound (acceptor) and an electron-donating material (donor) may be used for the electron injection layer according to the present invention. As the electron donor, any material having an electron-donating ability to the organic compound serving as an acceptor may be used. Alkali metals, alkaline-earth metals, rare-earth metals, and compounds containing these metals are preferred. Specific examples thereof include lithium, cesium, magnesium, calcium, erbium, ytterbium, and compounds containing these metals. Alkali metal oxides and alkaline-earth metal oxides are preferred. Lewis bases such as lithium oxide, calcium oxide, and magnesium oxide and barium oxide are more preferred. Organic materials such as tetrathiafulvalene may be used. Regarding the organic compound (acceptor), because an electron is given to the organic compound by the electron-donating material (donor), the composite material containing the mixture of the organic compound (acceptor) and the electron-donating material (donor) has good electron injection properties and good electron transport properties. In this case, as the organic compound (acceptor), for example, electron transport materials described below are preferred.

"Electron Transport Layer"

As a material used for the electron transport layer according to the present invention, a material whose electron transport ability is higher than its hole transport ability is preferably used. Examples thereof include π-electron-deficient heteroaromatic compounds such as nitrogen-containing heteroaromatic compounds and metal complexes. Specific examples thereof include metal complexes containing quinoline ligands, perylene ligands, benzoquinoline ligands, oxazole ligands, and thiazole ligands, fullerenes, oxadiazole derivatives, triazole derivatives, phenanthroline derivatives, pyridine derivatives, bipyridine derivatives, and pyrimidine derivatives.

More specific examples thereof include low-molecular-weight compounds such as tris(8-quinolinolato)aluminum (III) (Alq), tris(4-methyl-8-quinolinolato)aluminum(III) (Almq3), bis(10-hydroxybenzo[h]quinolinato)beryllium(II), bis(2-methyl-8-quinolinolato) (4-phenylphenolato)aluminum(III), bis(8-quinolinolato)zinc(II), bis[2-(2-benzooxazolyl)phenolato]zinc(II), bis[2-(2-benzothiazolyl)phenolato]zinc(II), 2-(4-biphenylyl)-5-(4-tert-butylphenyl)-1,3,4-oxadiazole, 1,3-bis[5-(p-tert-butylphenyl)-1,3,4-oxadiazol-2-yl]benzene, 9-[4-(5-phenyl-1,3,4-oxadiazol-2-yl)phenyl]-9H-carbazole, 3-(4-biphenylyl)-4-phenyl-5-(4-tert-butylphenyl)-1,2,4-triazole, 2,2',2'''-(1,3,5-benzenetriyl)tris (1-phenyl-1H-benzimidazole), 2-[3-(dibenzothiophen-4-yl) phenyl]-1-phenyl-1H-benzimidazole, bathophenanthroline, bathocuproine, 2-[3-(dibenzothiophen-4-yl)phenyl]dibenzo [f,h]quinoxaline, 2-[3'-(dibenzothiophen-4-yl)biphenyl-3-yl]dibenzo[f,h]quinoxaline, 2-[3'-(9H-carbazol-9-yl)biphenyl-3-yl]dibenzo[f,h]quinoxaline, 2-[4-(3,6-diphenyl-9H-carbazol-9-yl)phenyl]dibenzo[f,h]quinoxaline, 7-[3-(dibenzothiophen-4-yl)phenyl]dibenzo[f,h]quinoxaline, 6-[3-(dibenzothiophen-4-yl)phenyl]dibenzo[f,h]quinoxaline, diazines, e.g., 4,6-bis[3-(phenanthren-9-yl)phenyl]pyrimidine, 4,6-bis[3-(4-dibenzothienyl)phenyl]pyrimidine, and 4,6-bis[3-(9H-carbazol-9-yl)phenyl]pyrimidine, 2-{4-[3-(N-phenyl-9H-carbazol-3-yl)-9H-carbazol-9-yl]phenyl}-4,6-diphenyl-1,3,5-triazine, 3,5-bis[3-(9H-carbazol-9-yl) phenyl]pyridine, 1,3,5-tri[3-(3-pyridyl)phenyl]benzene, and 4,4'-bis(5-methylbenzoxazol-2-yl)stilbene. Furthermore, a polymer such as poly(2,5-pyridinediyl), poly[(9,9-dihexylfluoren-2,7-diyl)-co-(pyridin-3,5-diyl)], or poly[(9,9-dioctylfluoren-2,7-diyl)-co-(2,2'-bipyridin-6,6'-diyl)] may be used.

The electron transport layer according to the present invention preferably has an average thickness of 7 nm to 300 nm. The electron transport layer may be formed of a single layer or a stack of two or more layers composed of the foregoing material, as needed. A functional layer such as a hole-blocking layer that can control electron transfer may be disposed between the electron transport layer and the light-emitting layer.

The above structure is seemingly effective in inhibiting or preventing a decrease in the lifetime of the light-emitting device.

"Light-Emitting Layer"

The light-emitting layer 5 according to the present invention preferably has the peak of an emission spectrum in the blue wavelength region. The light-emitting layer may be formed of a single layer or multiple layers including two or more layers containing a light-emitting material described below. An example of a structure including three light-emitting layers is a structure in which one of the light-emitting layers emits light in the blue wavelength region (420 nm or more and 480 nm or less), another light-emitting layer emits light in the green wavelength region (500 to 560 nm), and the other light-emitting layer emits light in the red wavelength region (620 to 650 nm). In this case, a buffer layer may be disposed between the blue light-emitting layer, the green light-emitting layer, and the red light-emitting layer in contact with the green light-emitting layer. An example of a structure including two light-emitting layers is a structure in which one of the light-emitting layers emits light in the blue wavelength region (420 nm or more and 480 nm or less) and the other light-emitting layer emits light in the yellow wavelength region (570 to 590 nm). In this case, a buffer layer may be disposed between the blue light-emitting layer and the yellow light-emitting layer, as needed. In the case where the light-emitting layer is formed of a single layer, the light-emitting layer preferably emits light in the blue wavelength region (420 nm or more and 480 nm or less), more preferably emits light in the blue wavelength region (430 nm or more and 470 nm or less), even more preferably emits light in the blue wavelength region (440 nm or more and 460 nm or less).

In a particularly preferred embodiment of the present invention, the light-emitting layer is formed of a single layer that emits light in the blue wavelength region (420 nm or more and 480 nm or less). As described above, the color display method of the present invention is preferably a display method in which a light-emitting layer that emits blue light, a light conversion layer that converts the blue light from the light-emitting layer into green light, and a light conversion layer that converts the blue light from the light-emitting layer into red light are combined together to produce three colors. The blue color obtained from the blue-light-emitting layer is used as a blue color, and the light-emitting nanocrystals that differ in particle size and material are used to produce the green color and the red color, thereby producing three colors.

The light-emitting layer according to the present invention can be formed by a physical vapor deposition (PVD) method such as a vacuum evaporation method, a printing method such as a screen printing method or an inkjet printing method, a laser transfer method, or an application method such as a spin coating method. For example, the blue-light-emitting layer according to the preferred embodiment can be formed by, for example, an evaporation method. For example, the blue-light-emitting layer is preferably formed by a vacuum evaporation method at a deposition rate of 0.05 to 2 nm/s using, for example, 4,4'-N,N'-dicarbazolyl-biphenyl (CBP, blue-light-emitting host material), 9-(4-tert-butylphenyl)-3,6-ditrityl-9H-carbazole (CzC, blue-light-emitting host material), 1,3-di-9-carbazolylbenzene (mCP, blue-light-emitting host material), or BD102 (blue-fluorescence-emitting material serving as a blue-light-emitting dopant, available from Idemitsu Kosan Co., Ltd).

The light-emitting layer according to the present invention preferably contains a light-emitting material (also referred to as a "guest material" or "dopant") and a host material. The light-emitting layer has an average thickness of 1 to 60 nm. The mixing ratio (by mass) of the host material to the guest material is not particularly limited and is preferably adjusted to, for example, 10:1 to 300:1.

Examples of the light-emitting material according to the present invention include light-emitting materials capable of converting singlet excitation energy into light emission and light-emitting materials capable of converting triplet excitation energy into light emission. As a light-emitting material contained in the electroluminescent layer according to the present invention, one or two or more selected from the group consisting of an inorganic light-emitting material, an organic low-molecular-weight fluorescent material, an organic polymer fluorescent material, and organic phosphorescent materials are preferably contained.

Examples of the light-emitting material capable of converting singlet excitation energy into light emission include the low-molecular-weight fluorescent material that fluoresces and the organic polymer fluorescent material.

The low-molecular-weight fluorescent material is preferably a compound having an anthracene moiety, a tetracene moiety, a chrysene moiety, a phenanthrene moiety, a pyrene moiety, a perylene moiety, a stilbene moiety, an acridone moiety, a coumarin moiety, a phenoxazine moiety, and a phenothiazine moiety. Examples thereof include 5,6-bis[4-(10-phenyl-9-anthryl)phenyl]-2,2'-bipyridine, 5,6-bis[4'-(10-phenyl-9-anthryl)biphenyl-4-yl]-2,2'-bipyridine, N,N'-bis[4-(9H-carbazol-9-yl)phenyl]-N,N'-diphenylstilbene-4,4'-diamine, 4-(9H-carbazol-9-yl)-4'-(10-phenyl-9-anthryl)triphenylamine, 4-(9H-carbazol-9-yl)-4'-(9,10-diphenyl-2-anthryl)triphenylamine, N,9-diphenyl-N-[4-(10-phenyl-9-anthryl)phenyl]-9H-carbazole-3-amine, 4-(10-phenyl-9-anthryl)-4'-(9-phenyl-9H-carbazol-3-yl)triphenylamine, 4-[4-(10-phenyl-9-anthryl)phenyl]-4'-(9-phenyl-9H-carbazol-3-yl)triphenylamine, perylene, 2,5,8,11-tetra(tert-butyl)perylene, N,N'-diphenyl-N,N'-bis[4-(9-phenyl-9H-fluoren-9-yl)phenyl]pyrene-1,6-diamine, N,N'-bis(3-methylphenyl)-N,N'-bis[3-(9-phenyl-9H-fluoren-9-yl)phenyl]-pyrene-1,6-diamine, N,N'-bis(dibenzofuran-2-yl)-N,N'-diphenylpyrene-1,6-diamine, N,N'-bis(dibenzothiophen-2-yl)-N,N'-diphenylpyrene-1,6-diamine, N,N''-(2-tert-butylanthracen-9,10-diyldi-4,1-phenylene)bis[N,N',N'-triphenyl-1,4-phenylenediamine], N,9-diphenyl-N-[4-(9,10-diphenyl-2-anthryl)phenyl]-9H-carbazole-3-amine, N-[4-(9,10-diphenyl-2-anthryl)phenyl]-N, N',N'-triphenyl-1,4-phenylenediamine, N, N,N',N',N'',N'',N''',N'''-octaphenyldibenzo[g,p]chrysene-2,7,10,15-tetraamine, coumarin 30, N-(9,10-diphenyl-2-anthryl)-N,9-diphenyl-9H-carbazole-3-amine, N-(9,10-diphenyl-2-anthryl)-N,N',N'-triphenyl-1,4-phenylenediamine, N, N, 9-triphenylanthracene-9-amine, coumarin 6, coumarin 545T, N,N'-diphenylquinacridon, rubrene, 5,12-bis(1,1'-biphenyl-4-yl)-6,11-diphenyltetracene, 2-(2-{2-[4-(dimethylamino)phenyl]ethenyl}-6-methyl-4H-pyran-4-ylidene)propanedinitrile, 2-{2-methyl-6-[2-(2,3,6,7-tetrahydro-1H, 5H-benzo[ij]quinolizin-9-yl) ethenyl]-4H-pyran-4-ylidene}propanedinitrile, N,N,N',N'-tetrakis(4-methylphenyl)tetracene-5,11-diamine, 7,14-diphenyl-N,N,N',N'-tetrakis(4-methylphenyl)acenaphtho[1,2-a]fluoranthene-3,10-diamine, 2-{2-isopropyl-6-[2-(1,1,7,7-tetramethyl-2,3,6,7-tetrahydro-1H, 5H-benzo[ij]quinolizin-9-yl)ethenyl]-4H-pyran-4-ylidene}propanedinitrile, 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile, 2-(2,6-bis{2-[4-(dimethylamino)phenyl]ethenyl}-4H-pyran-4-ylidene)propanedinitrile, 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile, and 5,10,15,20-tetraphenylbisbenzo[5,6]indeno[1,2,3-cd:1',2',3'-lm]perylene.

Examples of the organic polymer fluorescent material include compounds represented by formulae (P-1) to (P-4) illustrated below.

[Chem. 3]

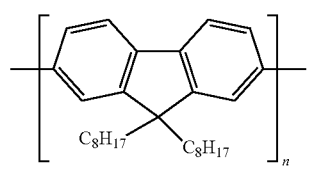

(P-1)

[Chem. 4]

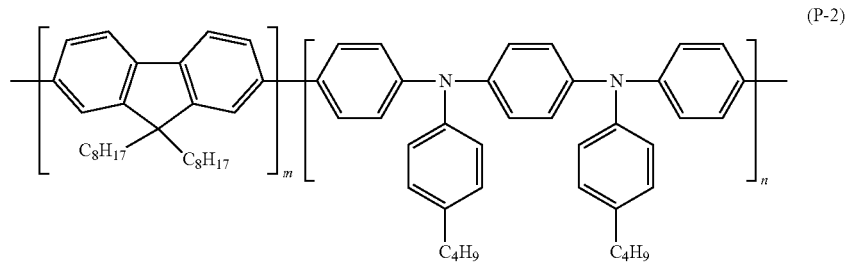

(P-2)

[Chem. 5]

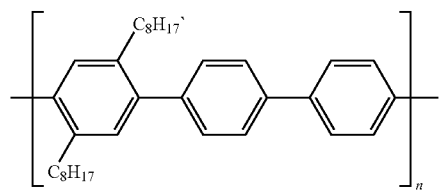
(P-3)

[Chem. 6]

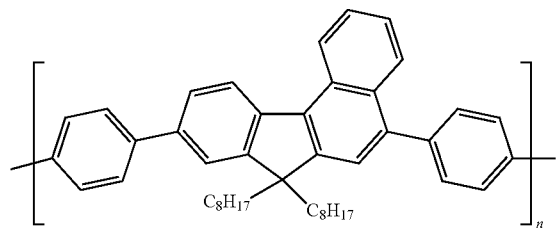
(P-4)

The light-emitting material capable of converting triplet excitation energy into light emission is preferably a phosphorescent material that phosphoresces. Specifically, the light-emitting material is preferably a metal complex containing at least one metal atom selected from the group consisting of iridium, rhodium, platinum, ruthenium, osmium, scandium, yttrium, gadolinium, palladium, silver, gold, and aluminum, more preferably a metal complex containing at least one metal atom selected from the group consisting of iridium, rhodium, platinum, ruthenium, osmium, scandium, yttrium, gadolinium, and palladium, even more preferably a metal complex containing at least one metal atom selected from the group consisting of iridium, rhodium, platinum, and ruthenium, particularly preferably an iridium complex or a platinum complex.

For example, one or two or more selected from the group consisting of compounds represented by formulae (I-1) to (I-12) illustrated below are preferred.

[Chem. 8]

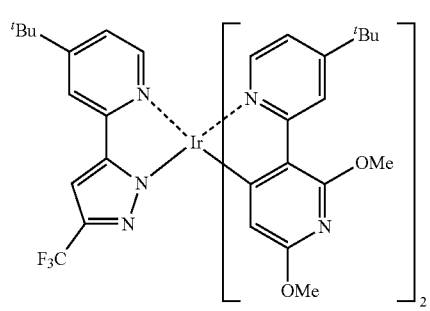
(I-2)

[Chem. 9]

[Chem. 7]

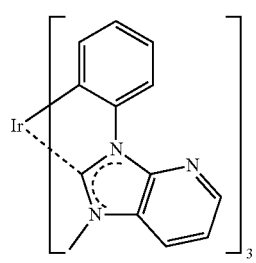
(I-1)

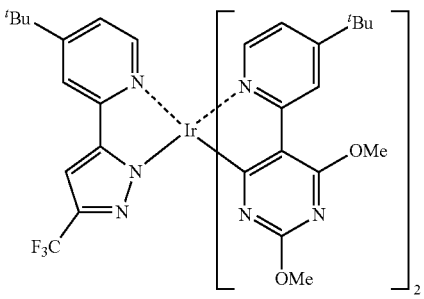
(I-3)

[Chem. 10]
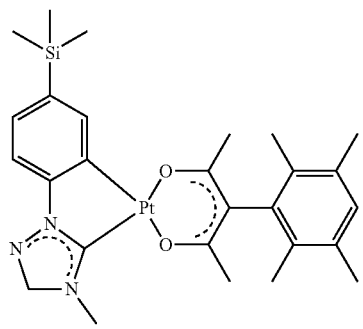
[Chem. 11]
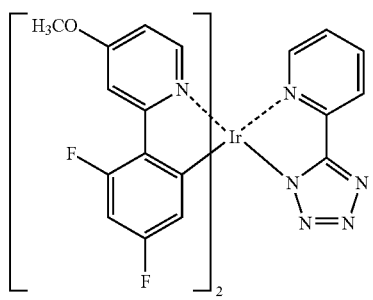
(I-5)
[Chem. 12]
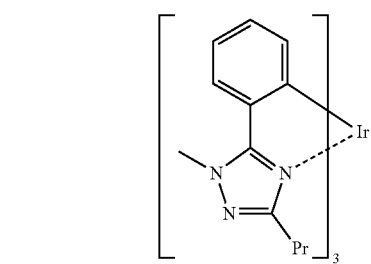
(I-6)
[Chem. 13]
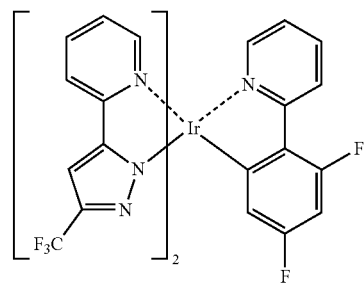
(I-7)
[Chem. 14]
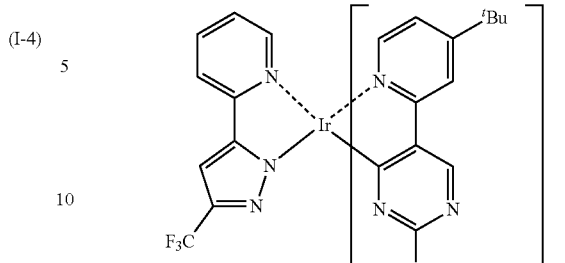
(I-8)
[Chem. 15]
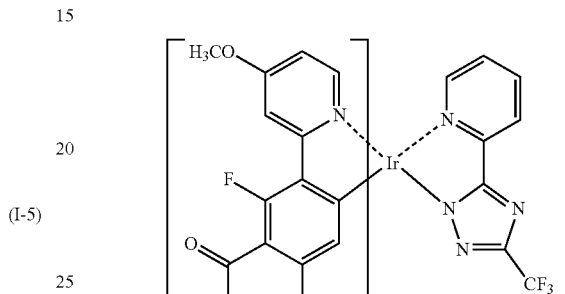
(I-9)
[Chem. 16]
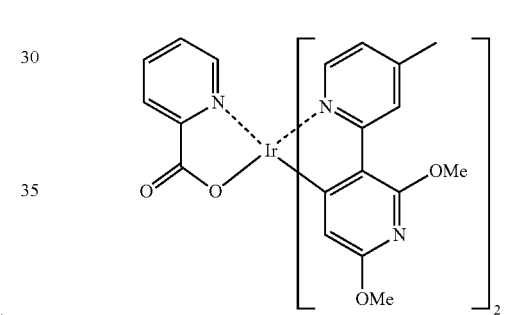
(I-10)
[Chem. 17]
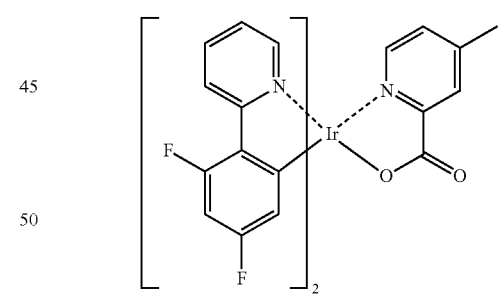
(I-11)
[Chem. 18]
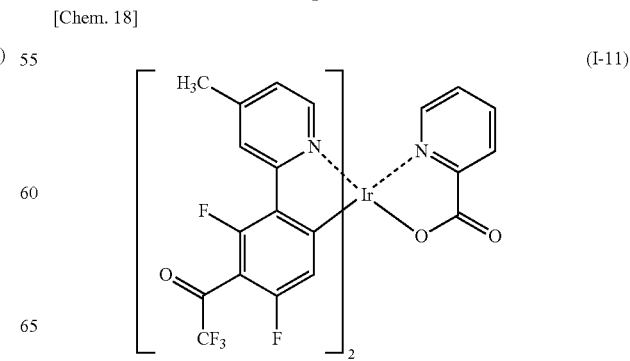
(I-11)

[Chem. 19]

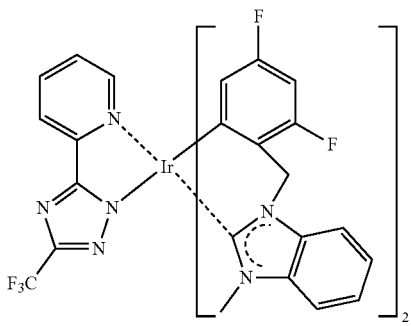

(I-12)

[Chem. 20]

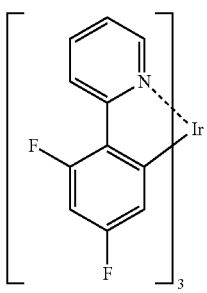

(I-13)

A compound having a blue emission peak used for the light-emitting layer according to the present invention is preferably an iridium metal complex or a platinum metal complex. In addition to the compounds, examples of the iridium metal complex include tris{2-[5-(2-methylphenyl)-4-(2,6-dimethylphenyl)-4H-1,2,4-triazol-3-yl-κN2]phenyl-κC}iridium(III), tris(5-methyl-3,4-diphenyl-4H-1,2,4-triazolato)iridium(III), tris[4-(3-biphenyl)-5-isopropyl-3-phenyl-4H-1,2,4-triazolato]iridium(III), tris[3-(5-biphenyl)-5-isopropyl-4-phenyl-4H-1,2,4-triazolato]iridium(III), tris[3-methyl-1-(2-methylphenyl)-5-phenyl-1H-1,2,4-triazolato]iridium(III), tris(1-methyl-5-phenyl-3-propyl-1H-1,2,4-triazolato)iridium(III), fac-tris[1-(2,6-diisopropylphenyl)-2-phenyl-1H-imidazole]iridium(III), tris[3-(2,6-dimethylphenyl)-7-methylimidazo[1,2-f]phenanthridinato]iridium(III), bis[2-(4',6'-difluorophenyl)pyridinato-N,C2']iridium(III) tetrakis(1-pyrazolyl)borate, bis[2-(4',6'-difluorophenyl)pyridinato-N,C2']iridium(III) picolinate, bis{2-[3',5'-bis(trifluoromethyl)phenyl]pyridinato-N,C2'}iridium(III) picolinate, and bis[2-(4',6'-difluorophenyl)pyridinato-N,C2']iridium(III) acetylacetonate.

Compounds illustrated below may also be appropriately used as a compound having a blue emission peak for use in the light-emitting layer according to the present invention.

[Chem. 21]

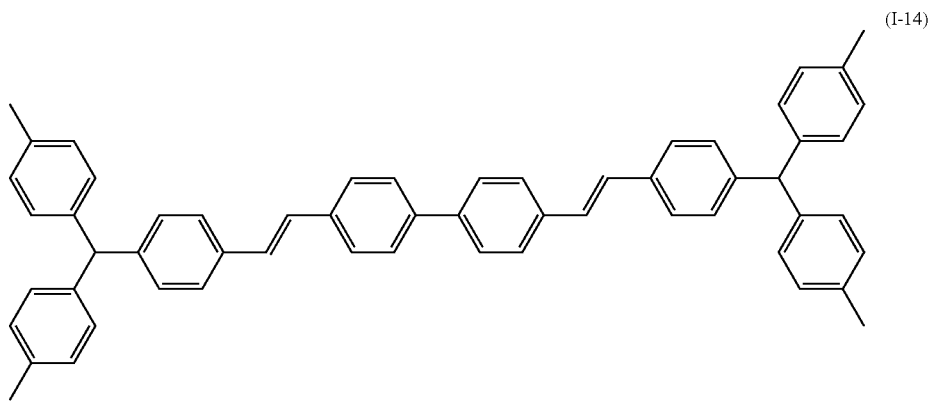

(I-14)

[Chem. 22]

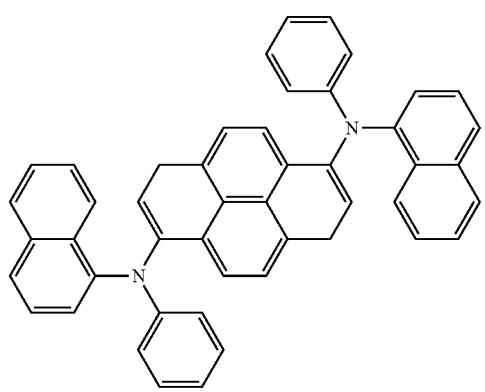

(I-15)

[Chem. 23]

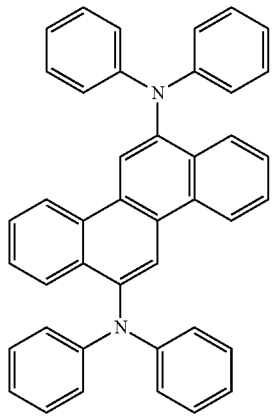

(I-16)

As a compound having a green or yellow emission peak used for the light-emitting layer according to the present invention, a known compound may be used. Examples thereof include tris(4-methyl-6-phenylpyrimidinato)iridium (III), tris(4-t-butyl-6-phenylpyrimidinato)iridium(III), (acetylacetonato)bis(6-methyl-4-phenylpyrimidinato) iridium(III), (acetylacetonato)bis(6-tert-butyl-4-phenylpyrimidinato)iridium(III), (acetylacetonato)bis[4-(2-norbornyl)-6-phenylpyrimidinato]iridium(III), (acetylacetonato) bis[5-methyl-6-(2-methylphenyl)-4-phenylpyrimidinato] iridium(III), (acetylacetonato)bis{4,6-dimethyl-2-[6-(2,6-dimethylphenyl)-4-pyrimidinyl-κN3]phenyl-KC}iridium (III), (acetylacetonato)bis(4,6-diphenylpyrimidinato) iridium(III), (acetylacetonato)bis(3,5-dimethyl-2-phenylpyrazinato)iridium(III), (acetylacetonato)bis(5-isopropyl-3-methyl-2-phenylpyrazinato)iridium(III), tris(2-phenylpyridinato-N,C2')iridium(III, bis(2-phenylpyridinato-N,C2')iridium(III) acetylacetonate, bis (benzo[h]quinolinato)iridium(III) acetylacetonate, tris (benzo[h]quinolinato)iridium(III), tris(2-phenylquinolinato-N,C2')iridium(III), bis(2-phenylquinolinato-N,C2')iridium (III) acetylacetonate, bis(2,4-diphenyl-1,3-oxazolato-N,C2') iridium(III) acetylacetonate, bis{2-[4'-(perfluorophenyl) phenyl]pyridinato-N,C2'}iridium(III) acetylacetonate, bis (2-phenylbenzothiazolato-N,C2')iridium(III) acetylacetonate and tris(acetylacetonato) (monophenanthroline)terbium(III).

As a compound having a yellow or red emission peak used for the light-emitting layer according to the present invention, a known compound may be used. Examples thereof include (diisobutylyl)bis[4,6-bis(3-methylphenyl) pyrimidinato]iridium(III), bis[4,6-bis(3-methylphenyl)pyrimidinato] (dipivaloylmethanato)iridium(III), bis[4,6-di (naphthalen-1-yl)pyrimidinato] (dipivaloylmethanato) iridium(III), (acetylacetonato)bis(2,3,5-triphenylpyrazinato) iridium(III), bis(2,3,5-triphenylpyrazinato) (dipivaloylmethanato)iridium(III), (acetylacetonato)bis[2,3-bis(4-fluorophenyl)quinoxalinato]iridium(III), tris(1-phenylisoquinolinato-N,C2')iridium(III), bis(1-phenylisoquinolinato-N,C2')iridium(III) acetylacetonate, 2,3,7,8,12,13,17, 18-octaethyl-21H,23H-porphyrinplatinum(II), tris(1,3-diphenyl-1,3-propanedionato) (monophenanthroline) europium(III), and tris[1-(2-thenoyl)-3,3,3-trifluoroacetonato] (monophenanthroline)europium(III).

As a host material for the light-emitting layer according to the present invention, a known material may be used. In this case, one or two or more compounds each having a larger energy gap than the light-emitting material described above are preferably selected and used as the host material. In the case where the light-emitting material is a phosphorescent material, a compound having higher triplet excitation energy (difference in energy between a ground state and a triplet excited state) than the light-emitting material is preferably selected as the host material.

Examples of the host material include tris(8-quinolinolato)aluminum(III), tris(4-methyl-8-quinolinolato)aluminum(III), bis(10-hydroxybenzo[h]quinolinato)beryllium(II), bis(2-methyl-8-quinolinolato) (4-phenylphenolato)aluminum(III), bis(8-quinolinolato)zinc(II), bis[2-(2-benzoxazolyl)phenolato]zinc(II), bis[2-(2-benzothiazolyl)phenolato]zinc(II), 2-(4-biphenylyl)-5-(4-tert-butylphenyl)-1,3,4-oxadiazole, 1,3-bis[5-(p-tert-butylphenyl)-1,3,4-oxadiazol-2-yl]benzene, 3-(4-biphenylyl)-4-phenyl-5-(4-tert-butylphenyl)-1,2,4-triazole, 2,2',2''-(1,3,5-benzenetriyl)tris (1-phenyl-1H-benzimidazole), bathophenanthroline, bathocuproine, 9-[4-(5-phenyl-1,3,4-oxadiazol-2-yl)phenyl]-9H-carbazole, 9,10-diphenylanthracene, N,N-diphenyl-9-[4-(10-phenyl-9-anthryl)phenyl]-9H-carbazole-3-amine, 4-(10-phenyl-9-anthryl)triphenylamine, N,9-diphenyl-N-{4-[4-(10-phenyl-9-anthryl)phenyl]phenyl}-9H-carbazole-3-amine, 6,12-dimethoxy-5,11-diphenylchrysene, 9-[4-(10-phenyl-9-anthracenyl)phenyl]-9H-carbazole, 3,6-diphenyl-9-[4-(10-phenyl-9-anthryl)phenyl]-9H-carbazole, 9-phenyl-3-[4-(10-phenyl-9-anthryl)phenyl]-9H-carbazole, 7-[4-(10-phenyl-9-anthryl)phenyl]-7H-dibenzo[c,g]carbazole, 6-[3-(9,10-diphenyl-2-anthryl)phenyl]-benzo[b]naphtho[1,2-d] furan, 9-phenyl-10-{4-(9-phenyl-9H-fluoren-9-yl)biphenyl-4'-yl}anthracene, 9,10-bis(3,5-diphenylphenyl)anthracene, 9,10-di(2-naphthyl)anthracene, 2-tert-butyl-9,10-di(2-naphthyl)anthracene, 9,9'-bianthryl, 9,9'-(stilben-3,3'-diyl)diphenanthrene, 9,9'-(stilben-4,4'-diyl)diphenanthrene, 1,3,5-tri(1-pyrenyl)benzene, 5,12-diphenyltetracene and 5,12-bis (biphenyl-2-yl)tetracene. These host materials for the light-emitting layer according to the present invention may be used alone or in combination of two or more of the compounds.

"Hole Injection Layer"

As a material used for the hole injection layer according to the present invention, a substance that prevents leakage current and improves the hole injection rate may be used. Examples thereof include transition metal oxides, phthalocyanine derivatives, aromatic amines, and conductive polymer compounds.

Examples of the transition metal oxides include molybdenum oxide, vanadium oxide, ruthenium oxide, tungsten oxide, and manganese oxide. Examples of the phthalocyanine derivatives include phthalocyanine and metal phthalocyanine such as copper phthalocyanine. Examples of the conductive polymer compounds include polythiophene, polyaniline, polypyrrole, poly(phenylene vinylene), poly (thienylene vinylene, polyquinone, polyquinoxaline, and poly(ethylene dioxythiophene)/poly(styrene sulfonic acid). Examples of the aromatic amines include benzidine derivatives, phenylenediamine derivatives, and triarylamine derivatives.

As with the electron injection layer, a composite material containing a mixture of an organic compound (acceptor) and an electron-donating material (donor) may be used for the hole injection layer according to the present invention. Examples of the electron-donating material (donor) include quinodimethan derivatives, chloranil derivatives, and hexaazatriphenylene derivatives. Specific examples thereof include 7,7,8,8-tetracyano-2,3,5,6-tetrafluoroquinodimethan, chloranil, and 2,3,6,7,10,11-hexacyano-1,4,5,8,9,12-hexaazatriphenylene. Furthermore, oxides of group 4 to 8 metals are exemplified as the electron-donating material (donor). Examples thereof include vanadium oxide, niobium oxide, tantalum oxide, chromium oxide, molybdenum oxide, tungsten oxide, manganese oxide, and rhenium oxide.

"Hole Transport Layer"

As a material used for the hole transport layer according to the present invention, a material whose hole transport ability is higher than its electron transport ability is preferably used. Examples thereof include aromatic amines, carbazole derivatives, aromatic hydrocarbons, and stilbene derivatives. For example, π-electron-rich heteroaromatic compounds and aromatic amines may be preferably used.

Examples of the material used for the hole transport layer according to the present invention include N,N'-di(p-tolyl)-N,N'-diphenyl-p-phenylenediamine, 4,4'-bis[N-(4-diphenylaminophenyl)-N-phenylamino]biphenyl, N,N'-bis{4-[bis(3-methylphenyl)amino]phenyl}-N,N'-diphenyl-(1,1'-biphenyl)-4,4'-diamine, 1,3,5-tris[N-(4-diphenylaminophenyl)-N-phenylamino]benzene, 3-[N-(4-diphenylaminophenyl)-N-phenylamino]-9-phenylcarbazole, 3,6-bis[N-(4-diphenylaminophenyl)-N-phenylamino]-9-phenylcarbazole, 3,6-bis[N-(4-diphenylaminophenyl)-N-(1-naphthyl)amino]-9-phenylcarbazole, 3-[N-(9-phenylcarbazol-3-yl)-N-phenylamino]-9-phenylcarbazole, 3,6-bis[N-(9-phenylcarbazol-3-yl)-N-phenylamino]-9-phenylcarbazole, 3-[N-(1-naphthyl)-N-(9-phenylcarbazol-3-yl)amino]-9-phenylcarbazole, 4,4'-di(N-carbazolyl)biphenyl, 1,3,5-tris[4-(N-carbazolyl)phenyl]benzene, 9-[4-(10-phenyl-9-anthryl)phenyl]-9H-carbazole, 1,4-bis[4-(N-carbazolyl)phenyl]-2,3,5,6-tetraphenylbenzene, 2-tert-butyl-9,10-di(2-naphthyl)anthracene, 2-tert-butyl-9,10-di(1-naphthyl)anthracene, 9,10-bis(3,5-diphenylphenyl)anthracene, 2-tert-butyl-9,10-bis(4-phenylphenyl)anthracene, 9,10-di(2-naphthyl) anthracene, 9,10-diphenylanthracene, 2-tert-butylanthracene, 9,10-bis(4-methyl-1-naphthyl)anthracene, 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, 4,4'-bis(2,2-diphenylvinyl)biphenyl, 9,10-bis[4-(2,2-diphenylvinyl)phenyl]anthracene, poly(N-vinylcarbazole), poly(4-vinyltriphenylamine), poly[N-(4-{N'-[4-(4-diphenylamino)phenyl]phenyl-N'-phenylamino}phenyl) methacrylamide], poly[N,N'-bis(4-butylphenyl)-N,N'-bis(phenyl)benzidine], 4,4'-bis[N-(1-naphthyl)-N-phenylamino]biphenyl, N,N'-bis(3-methylphenyl)-tris(carbazol-9-yl)triphenylamine, 4,4',4''-tris[N-(1-naphthyl)-N-phenylamino]triphenylamine, 4,4',4''-tris(N,N-diphenylamino)triphenylamine, 4,4',4''-tris[N-(3-methylphenyl)-N-phenylamino]triphenylamine, 4,4'-bis[N-(spiro-9,9'-bifluoren-2-yl)-N-phenylamino]biphenyl, 4-phenyl-4'-(9-phenylfluoren-9-yl)triphenylamine, 4-phenyl-3'-(9-phenylfluoren-9-yl)triphenylamine, N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine, N-(9,9-dimethyl-2-diphenylamino-9H-fluoren-7-yl)diphenylamine, 2-[N-(4-diphenylaminophenyl)-N-phenylamino]spiro-9,9'-bifluorene, 4-phenyl-4'-(9-phenyl-9H-carbazol-3-yl)triphenylamine, 4,4'-diphenyl-4''-(9-phenyl-9H-carbazol-3-yl)triphenylamine, 4-(1-naphthyl)-4'-(9-phenyl-9H-carbazol-3-yl)triphenylamine, 4,4'-di(1-naphthyl)-4'''-(9-phenyl-9H-carbazol-3-yl)triphenylamine, 4-phenyldiphenyl-(9-phenyl-9H-carbazol-3-yl)amine, N,N'-bis(9-phenylcarbazol-3-yl)-N,N'-diphenylbenzene-1,3-diamine, N,N',N''-triphenyl-N,N',N''-tris(9-phenylcarbazol-3-yl)benzene-1,3,5-triamine, N-(4-biphenyl)-N-(9,9-dimethyl-9H-fluoren-2-yl)-9-phenyl-9H-carbazole-3-amine, N-(1,1'-biphenyl-4-yl)-N-[4-(9-phenyl-9H-carbazol-3-yl)phenyl]-9,9-dimethyl-9H-fluorene-2-amine, 9,9-dimethyl-N-phenyl-N-[4-(9-phenyl-9H-carbazol-3-yl)phenyl]fluorene-2-amine, N-phenyl-N-[4-(9-phenyl-9H-carbazol-3-yl)phenyl]spiro-9,9'-bifluorene-2-amine, 2-[N-(9-phenylcarbazol-3-yl)-N-phenylamino]spiro-9,9'-bifluorene, 2,7-bis[N-(4-diphenylaminophenyl)-N-phenylamino]-spiro-9,9'-bifluorene, N-[4-(9H-carbazol-9-yl)phenyl]-N-(4-phenyl)phenylaniline, N,N'-bis[4-(carbazol-9-yl)phenyl]-N,N'-diphenyl-9,9-dimethylfluorene-2,7-diamine, 3-[4-(1-naphthyl)-phenyl]-9-phenyl-9H-carbazole, 3-[4-(9-phenanthryl)-phenyl]-9-phenyl-9H-carbazole, 3,3'-bis(9-phenyl-9H-carbazole), 1,3-bis(N-carbazolyl)benzene, 3,6-bis(3,5-diphenylphenyl)-9-phenylcarbazole, 4-{3-[3-(9-phenyl-9H-fluoren-9-yl)phenyl]phenyl}dibenzofuran, 4,4',4'''-(benzene-1,3,5-triyl)tri(dibenzofran), 1,3,5-tri(dibenzothiophen-4-yl)-benzene, 2,8-diphenyl-4-[4-(9-phenyl-9H-fluoren-9-yl)phenyl]dibenzothiophene, 4-[4-(9-phenyl-9H-fluoren-9-yl)phenyl]-6-phenyldibenzothiophene, and 4-[3-(triphenylen-2-yl)phenyl]dibenzothiophene. A functional layer such as an electron-blocking layer that can control electron transfer may be disposed between the hole transport layer and the light-emitting layer.

The layer containing a substance having high hole transport ability may be formed of a single layer or a stack of two or more layers containing the foregoing compound.

In the electroluminescent layer according to the present invention, it is preferable that the HOMO level of the compound of the hole transport layer be higher than the HOMO level of the compound of the electron transport layer and that the LUMO level of the compound of the hole transport layer be higher than the LUMO level of the compound of the electron transport layer. Thereby, an excited complex seems to be effectively formed.

As a light-emitting material for the light-emitting layer according to the present invention, a thermally activated delayed fluorescent (TADF) material may be used in place of the foregoing light-emitting material. The thermally activated delayed fluorescent material has a small difference between the singlet excitation energy level and the triplet excitation energy level and serves to convert energy through reverse intersystem crossing from the triplet excited state to the single excited state.

Examples of the thermally activated delayed fluorescent material include fullerenes and their derivatives, acridine derivatives (proflavine), porphyrin containing a metal containing at least one selected from the group consisting of magnesium, zinc, cadmium, tin, platinum, indium, and palladium, and heterocyclic thermally activated delayed fluorescent materials.

Examples of the porphyrin include protoporphyrin-tin fluoride complex (SnF$_2$ (Proto IX)), mesoporphyrin-tin fluoride complex (SnF$_2$ (Meso IX)), hematoporphyrin-tin fluoride complex (SnF$_2$ (Hemato IX)), coproporphyrin tetramethyl ester-tin fluoride complex (SnF$_2$ (Copro III-4Me)), octaethylporphyrin-tin fluoride complex (SnF$_2$ (OEP)), etioporphyrin-tin fluoride complex (SnF$_2$ (Etio I)), and octaethylporphyrin-platinum chloride complex (PtCl$_2$ OEP).

Examples of the heterocyclic thermally activated delayed fluorescent material include compounds represented by formulae (II-1) to (II-7) illustrated below.

[Chem. 24]

(II-1)

[Chem. 25]

(II-2)

[Chem. 26]

(II-3)

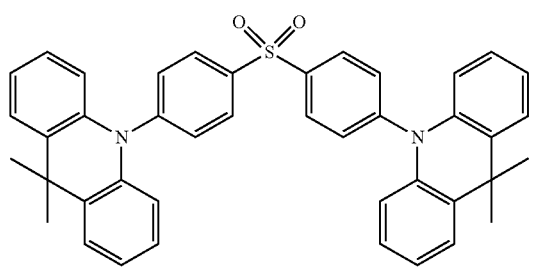

[Chem. 27]

(II-4)

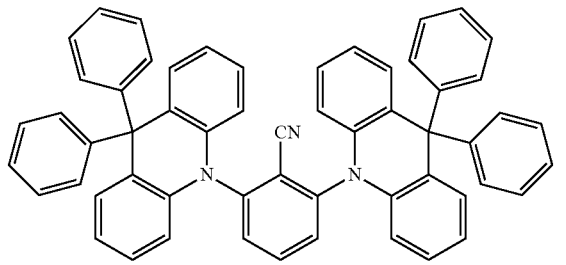

[Chem. 28]

(II-5)

[Chem. 29]

(II-6)

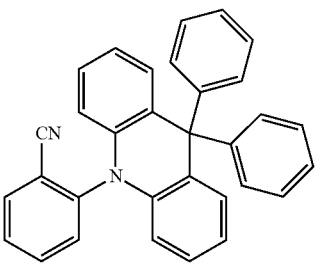

[Chem. 30]

(II-7)

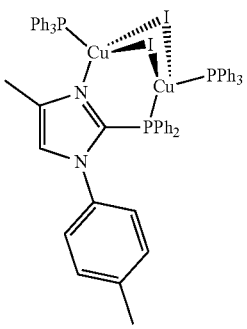

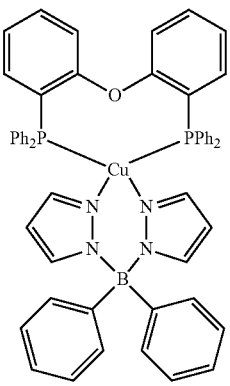

Other examples of the heterocyclic thermally activated delayed fluorescent material include 2-(biphenyl-4-yl)-4,6-bis(12-phenylindolo[2,3-a]carbazol-11-yl)-1,3,5-triazine, 2-{4-[3-(N-phenyl-9H-carbazol-3-yl)-9H-carbazol-9-yl]phenyl}-4,6-diphenyl-1,3,5-triazine, 2-[4-(10H-phenoxazin-10-yl)phenyl]-4,6-diphenyl-1,3,5-triazine, 3-[4-(5-phenyl-5,10-dihydrophenazin-10-yl)phenyl]-4,5-diphenyl-1,2,4-triazole, 3-(9,9-dimethyl-9H-acridin-10-yl)-9H- xanthen-9-one, bis[4-(9,9-dimethyl-9,10-dihydroacridine) phenyl]sulfone, and 10-phenyl-10H,10'H-spiro[acridine-9,9'-anthracen]-10'-one.

In the thermally activated delayed fluorescent material, a single type of compound may be used alone, or two or more types of compounds may be used in combination.

The electroluminescent layer (the light-emitting layer, the hole injection layer, the hole transport layer, the electron transport layer, and the electron injection layer) according to the present invention may be formed by a known production method. Examples thereof include an evaporation method, a vacuum deposition method, an inkjet method, an application method, and gravure printing.

A second aspect of the present invention is directed to providing an image display apparatus including a light-emitting device and a transistor layer.

Specifically, the image display apparatus according to the present invention includes a pair of electrodes including a first electrode and a second electrode disposed opposite each other, an electroluminescent layer disposed between the first electrode and the second electrode, a light conversion layer including multiple pixels and converting light that is emitted from the electroluminescent layer and that has a blue emission spectrum into light having a different wavelength, and a transistor layer electrically connected to the first electrode or the second electrode, in which the light conversion layer includes pixels of three primary colors of red (R), green (G), and blue (B) and contains a light-emitting nanocrystal having an emission spectrum in any of red (R), green (G), and blue (B) when the light from the electroluminescent layer is incident on at least one of the three primary colors.

The image display apparatus according to the present invention includes multiple pixels arranged in a grid. The pixels include the light-emitting device and the transistor layer including a pixel circuit that drives the light-emitting device. Light emission is controlled by signals from a scan line driver circuit and a signal line driver circuit. The transistor layer according to the present invention will be described below with reference to FIGS. 8 and 9.

Figure 8:
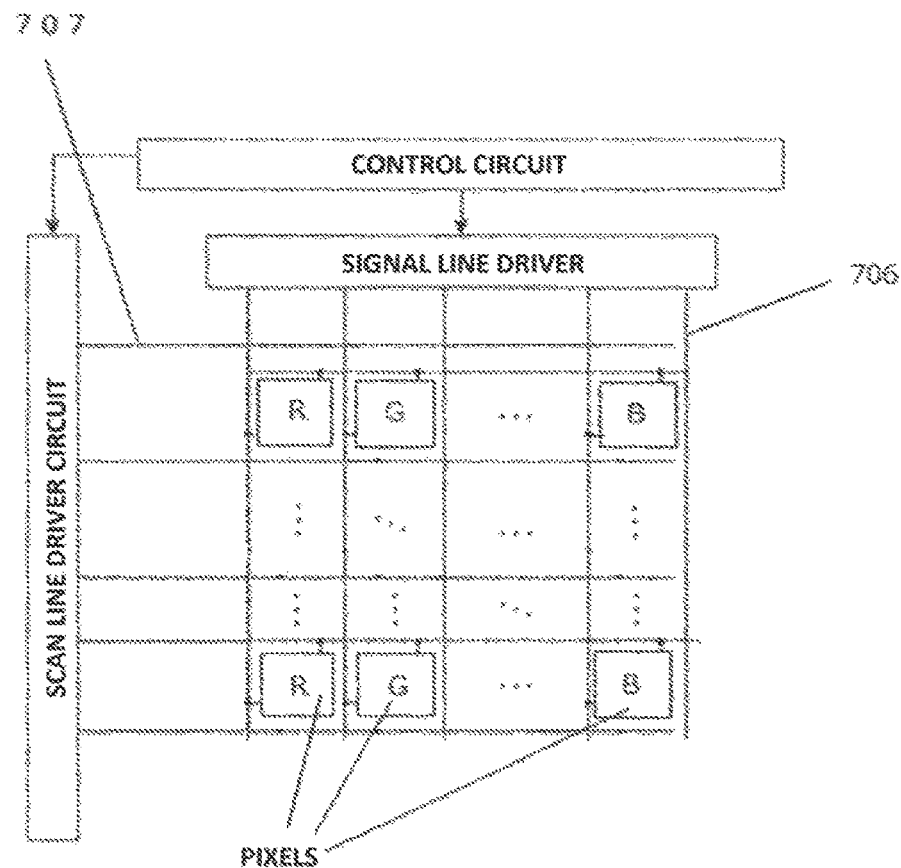
FIG. 8 is a schematic circuit diagram illustrating a transistor layer according to the present invention.
Figure 9:
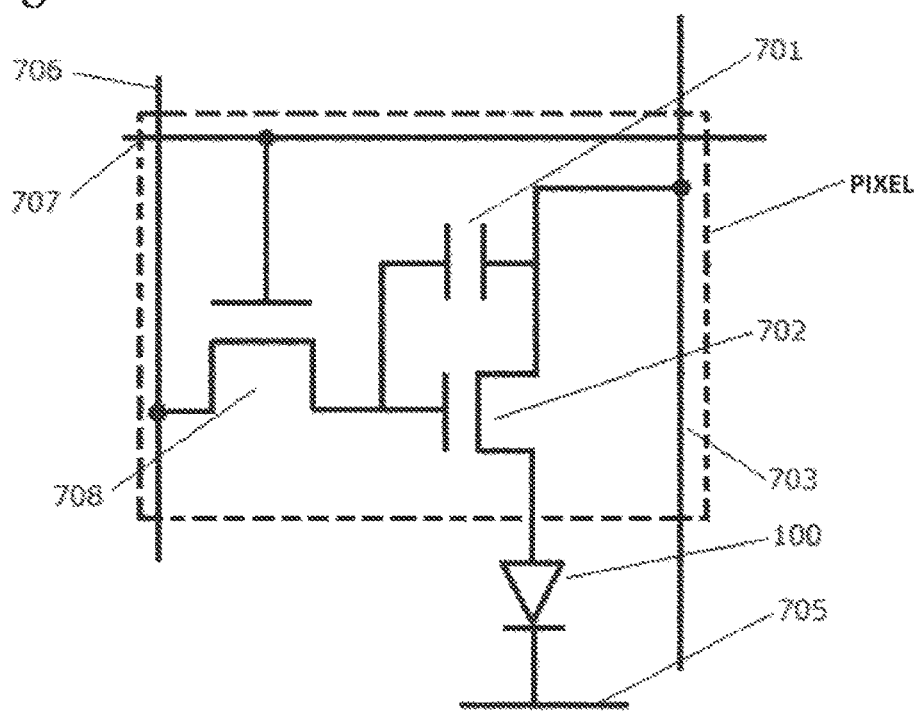
FIG. 9 is a schematic circuit diagram illustrating a transistor layer according to the present invention.

FIG. 8 is a schematic circuit diagram illustrating a transistor layer according to the present invention and illustrates an example of the circuit configuration of pixels in the image display apparatus according to the present invention. In FIGS. 8 and 9, R, G, and B regions each correspond to one pixel. The transistor layer includes at least two of a switching transistor 708 and a driver transistor 702 in each pixel. In the transistor layer, a control circuit controls the scan line driver circuit, the signal line driver circuit, and an image display portion (not illustrated) and outputs a signal voltage based on an image signal input from the outside to the signal line driver circuit. The image display portion (not illustrated) includes the multiple pixels (R, G, and B) arranged in a grid. An image is displayed in the image display portion on the basis of the image signal. The scan line driver circuit outputs a scan signal to scan lines 707 to control the ON/OFF of the conduction of the switching transistors 708 in the pixels. The signal line driver circuit is connected to signal lines 706 and has the function of outputting a signal voltage based on an image signal to the pixels.

As illustrated in FIGS. 8 and 9, the signal lines 706 connect the signal line driver circuit to the respective pixels and have the function of supplying a signal voltage based on an image signal to each pixel. The scan lines 707 connect the scan line driver circuit to the light-emitting pixels and have the function of supplying the timing of writing the signal voltage.

As illustrated in FIG. 9, each pixel includes the driver transistor 702, the switching transistor 708, a capacitor 701, the light-emitting device 100, the signal line 706, the scan line 707, a power supply line 703, and a common electrode 705. The driver transistor 702 is a driver element in which a gate electrode is connected to one electrode of the capacitor 701, a source electrode is connected to an anode electrode (anode, first electrode) of the light-emitting device 100, and a drain electrode is connected to the other electrode of the capacitor 701 and to the power supply line 703. The driver transistor 702 converts a voltage corresponding to a signal voltage applied between the gate electrode and the source electrode into a drain current corresponding to the signal voltage. The drain current is supplied to the light-emitting device 100 as a signal current. The driver transistor 702 is preferably formed of a known thin-film transistor or the like. The power supply line 703 is a line to apply a voltage to the drain electrode of the driver transistor 702. The common electrode 705 is an electrode to apply a voltage to the cathode electrode of the light-emitting device 100.

The switching transistor 708 is a switching element in which a gate electrode is connected to the scan line 707, one of a source electrode and a drain electrode is connected to the gate electrode of the driver transistor 702, and the remaining one of the source electrode and the drain electrode is connected to the signal line 706. The capacitor 701 is a capacitive element in which one electrode is connected to the gate electrode of the driver transistor 702 and the other electrode is connected to the drain electrode of the driver transistor 702.

The light-emitting device 100 is a light-emitting device in which a cathode electrode (cathode, second electrode) is connected to the common electrode 705, the anode electrode (anode, first electrode) is connected to the source electrode of the driver transistor 702, and light is emitted in accordance with a current supplied from the driver transistor 702.

As illustrated in FIGS. 1 to 7 and described above, the light-emitting device 100 according to the present invention is a top-emission light-emitting device in which light emitted by the recombination of holes injected from the first electrode 2 with electrons injected from the second electrode 8 is displayed from the second electrode 8 side. Thus, in an image display apparatus 101 according to the present invention, the transistor layer including the transistor that drives the pixel circuit is preferably disposed between the first electrode 2 and the substrate 1 with reference to, for example, FIG. 1. In this case, the transistor layer is preferably electrically connected to the first electrode 2.

In the case where the light-emitting device 100 or the image display apparatus according to the present invention is of a top-emission type, the substrate 11 and an overcoat layer is preferably transparent. A polarizing layer may be disposed on the substrate 11 to block light coming from the outside, as needed.

The light-emitting device according to the present invention may be of a bottom-emission type in which light is taken from the first electrode 2 side.

An embodiment of the bottom-emission image display apparatus will be described below with reference to FIG. 10. FIG. 10 is a schematic cross-sectional view illustrating the image display apparatus 101. The image display apparatus 101 of the present invention includes the light-emitting device 100 and a transistor layer 20. The light-emitting device 100 includes the first electrode 2 and the second electrode 8 as a pair of opposite electrodes, the electroluminescent layer 12 disposed between the electrodes, and the light conversion layer 9 disposed on the other surface of the first electrode 2. The transistor layer 20 including a transistor that drives a pixel circuit is disposed between the substrate 1 and the light conversion layer 9.

The electroluminescent layer 12 only needs to include at least the light-emitting layer 5. The electroluminescent layer 12 according to the present invention preferably includes the hole injection layer 3, the hole transport layer 4, the light-emitting layer 5, the electron transport layer 6, and the electron injection layer 7. Similarly, in the bottom-emission light-emitting device and the bottom-emission image display apparatus, an electron-blocking layer may be disposed between the light-emitting layer 5 and the electron transport layer 6, as needed, and a hole-blocking layer may be disposed between the hole transport layer 4 and the light-emitting layer 5, as needed. As the light-emitting layer 5, a light-emitting layer that emits blue light is preferred.

In the light-emitting device 100 of the image display apparatus, the electroluminescent layer 12 includes the hole injection layer 3 in contact with the first electrode 2 and has a structure in which the hole transport layer 4, the light-emitting layer 5, and the electron transport layer 6 are stacked in this order.

In an embodiment of the present invention, in the following description, for convenience, the first electrode 2 serves as an anode, and the second electrode 8 serves as a cathode. However, the structure of the light-emitting device 100 is not limited thereto. The first electrode 2 serving as a cathode and the second electrode 8 serving as an anode may be used, and the layers between these electrodes may be stacked in reverse order. In other words, the hole injection layer, the hole transport layer, the light-emitting layer, the electron transport layer, and the electron injection layer may be stacked in this order from the second electrode 8 adjacent to the anode.

In the case of the bottom-emission type, because light emerges from the first electrode 2 side, the second electrode 8 is preferably a light-reflecting electrode having the function of reflecting light (for example, Al or ITO/Ag/ITO). In the case of the top-emission type, the second electrode 8 is preferably a transparent electrode.

In the image display apparatus 101 illustrated in FIG. 10, the application of a voltage between the first electrode 2 and the second electrode 8 permits electrons to be injected from the second electrode 8 of the cathode into the electroluminescent layer 12 and permits holes to be injected from the first electrode 2 of the anode into the electroluminescent layer 12, so that a current flows. The electrons and the holes injected are recombined to form excitons. As a result, the light-emitting material contained in the light-emitting layer 5 is in an excited state to emit light from the light-emitting material. Then light emitted from the light-emitting layer 5 is incident on a surface of the light conversion layer 9 through the hole transport layer 4, the hole injection layer 3, the first electrode (first transparent electrode) 2, and the transistor layer 20. The light incident on the light conversion layer 9 is absorbed by the light-emitting nanocrystals and converted into light having an emission spectrum in any of red (R), green (G), and blue (B), so that any of red (R), green (G), and blue (B) can be displayed. Light that is a component of the light emitted from the light-emitting layer 5 and that travels toward the second electrode 8 side is reflected from the second electrode 8 (reflecting electrode), travels toward the first electrode 2 side, and is converted by the light conversion layer 9 into an emission spectrum, so that any of red (R), green (G), and blue (B) can be displayed.

The image display apparatus according to the present invention includes the transistor layer electrically connected to the first electrode or the second electrode. Light emitted from the electroluminescent layer is displayed through the light conversion layer and the transistor layer.

The top-emission image display apparatus preferably has a structure in which the substrate 1, the transistor layer 20, the first electrode 2, the hole injection layer 3, the hole transport layer 4, the light-emitting layer 5, the electron transport layer 6, the electron injection layer 7, the second electrode 8, the light conversion layer 9, and the substrate 11 are stacked in this order. Thus, light emitted from the electroluminescent layer 12 is displayed without passing through the transistor layer 20. As the light-emitting layer 5, a light-emitting layer that emits blue light is preferred.

The polarizing layer according to the present invention is not particularly limited. A known polarizer (polarizing layer) may be used. Examples thereof include dichroic organic dye polarizers, polarizing layers formed by coating, wire-grid polarizers, and cholesteric liquid crystal polarizers. For example, preferably, the wire-grid polarizer is formed on a first substrate, a second substrate, or a color filter by one selected from nanoimprinting methods, block copolymer methods, E-beam lithography methods, and glancing angle deposition methods.

EXAMPLES

While the present invention will be described below in more detail by examples, the present invention is not limited thereto.

(1) Production of Image Display Apparatus Panel (Production of Light Conversion Layer or Color Filter)

(A) Production of Red-Light-Emitting-Nanocrystal-Containing Composition, Green-Light-Emitting-Nanocrystal-Containing Composition, and Blue (-Light-Emitting-Nanocrystal-Containing) Composition

[Light Diffusing Particle Dispersion]

In a container filled with nitrogen gas, 2.4 g of titanium oxide (trade name: MPT141, available from Ishihara Sangyo Kaisha, Ltd., average particle size (volume average size): 100 nm), 0.4 g of DISPERBYK-2164 (trade name of BYK, "DISPERBYK" is a registered trademark) as a polymer dispersant, and 1,4-butanediol diacetate were mixed. Then zirconia beads (diameter: 1.25 mm) were added to the resulting mixture. The mixture was shaken with a paint conditioner to perform dispersion treatment of the mixture. Removal of the zirconia beads with a polyester mesh filter resulted in a light diffusing particle dispersion 1 (non-volatile content: 44% by mass).

[Red-Light-Emitting-Nanocrystal-Containing Composition 1]

First, 30 parts by mass of red-light-emitting nanocrystals (CdSe/ZnS oleylamine ligand, emission peak: 620 nm), 30 parts by mass of dipentaerythritol hexaacrylate (KAYARAD (trade name) DPHA, available from Nippon Kayaku Co., Ltd.), 5 parts by mass of a polymerization initiator (Irgacure-907 (tradename), available from BASF), and 30 parts by mass of a polyester acrylate resin (Aronix (trade name) M7100, available from Toagosei Co., Ltd.) were mixed and diluted with propylene glycol monomethyl ether acetate so as to have a solid content of 20% by mass. The mixture was stirred with a dispersion stirrer and filtered with a filter having a pore size of 1.0 µm to provide a red-light-emitting-nanocrystal-containing composition 1.

[Red-Light-Emitting-Nanocrystal-Containing Composition 2]

A red-light-emitting-nanocrystal-containing composition 2 was prepared in the same way as above, except that red-light-emitting nanocrystals (InP/ZnS oleylamine ligand, emission peak: 530 nm) was used in place of the red-light-emitting nanocrystals CdSe/ZnS in the red-light-emitting-nanocrystal-containing composition.

[Red-Light-Emitting Nanocrystal-Containing Composition 3]

Into a reaction flask, 5 g of trioctylphosphine oxide (TOPO), 1.46 g (5 mmol) of indium acetate, and 3.16 g (15.8 mmol) of lauric acid were charged, thereby preparing a mixture. The mixture was heated at 160° C. for 40 minutes in a nitrogen ($N_2$) environment and then heated under vacuum at 250° C. for 20 minutes. The reaction temperature (the temperature of the mixture) was increased to 300° C. in the nitrogen ($N_2$) environment. At this temperature, a mixture of 3 g of 1-octadecene (ODE) and 0.25 g (1 mmol) of tris(trimethylsilyl)phosphine was rapidly introduced into the reaction flask. The reaction temperature was maintained at 260° C. After 5 minutes, a heater was removed to stop the reaction. The resulting reaction solution was cooled to room temperature. Then 8 ml of toluene and 20 ml of ethanol were added to the reaction solution in a glove box. Subsequently, centrifugal separation was performed to precipitate InP nanocrystalline particles. The decantation of the supernatant fluid resulted in the InP nanocrystal particles. The resulting InP nanocrystalline particles were dispersed in hexane, thereby preparing a dispersion (hexane dispersion) containing 5% by mass InP nanocrystalline particles.

To a reaction flask, 2.5 g of the hexane dispersion of InP nanocrystalline particles (InP cores) was added. Then 0.7 g of oleic acid was added to the reaction flask at room temperature. The temperature thereof was increased to 80° C. and maintained for 2 hours. Subsequently, 1 ml of 1-octadecene (ODE) containing 14 mg of diethylzinc, 8 mg of bis(trimethylsilyl)selenide, and 7 mg of hexamethyldisilathiane dissolved therein (ZnSeS precursor solution) was added dropwise to the reaction mixture. The temperature of the mixture was increased to 200° C. and maintained for 10 minutes, thereby forming ZnSeS shells having a thickness of 0.5 monolayer.

The temperature thereof was increased to 140° C. and maintained for 30 minutes. A ZnS precursor solution prepared by dissolving 69 mg of diethylzinc and 66 mg of hexamethyldisilathiane in 2 ml of ODE was added dropwise to the reaction mixture. The temperature thereof was increased to 200° C. and maintained for 30 minutes, thereby forming ZnS shells having a thickness of 2 monolayers. After 10 minutes of the dropwise addition of the ZnS precursor solution, a heater was removed to stop the reaction. The reaction mixture was cooled to room temperature. The resulting white precipitate was removed by centrifugal separation, thereby providing a transparent nanocrystal dispersion (ODE dispersion of InP/ZnSeS/ZnS nanocrystalline particles) containing red-light-emitting InP/ZnSeS/ZnS nanocrystalline particles dispersed therein.

A ligand represented by formula (1A) below was obtained from JEFFAMINE M-1000 (available from Huntsman Corp.) and succinic anhydride (available from Sigma-Aldrich) in a molar amount equal to that of JEFFAMINE M-1000 under a stream of nitrogen gas.

[Chem. 31]

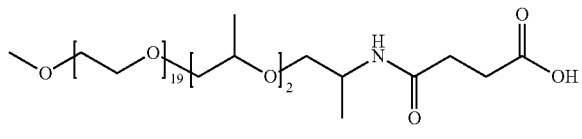

(1A)

Then 30 mg of the organic ligand represented by formula (1A) was added to the 1 ml of ODE dispersion of the InP/ZnSeS/ZnS nanocrystalline particles. The mixture was heated at 90° C. for 5 hours to exchange the ligand. The nanocrystalline particles aggregated as the ligand exchange proceeded. After the completion of the ligand exchange, the decantation of the supernatant fluid resulted in nanocrystalline particles. To the nanocrystalline particles, 3 ml of ethanol was added. The mixture was subjected to ultrasonic treatment to perform redispersion. Then 10 ml of n-hexane was added to 3 mL of the ethanol dispersion of the nanocrystalline particles. Subsequently, centrifugal separation was performed to precipitate nanocrystalline particles. The decantation of the supernatant fluid and evaporation were performed under vacuum to provide nanocrystalline particles (InP/ZnSeS/ZnS nanocrystalline particles modified with the organic ligand). The organic ligand content was 30% by mass based on the total amount of the nanocrystalline particles modified with the organic ligand.

The nanocrystalline particles (the InP/ZnSeS/ZnS nanocrystalline particles modified with the organic ligand) were dispersed in EOEOA in such a manner that the resulting dispersion had a nanocrystalline particle content of 34.5% by mass, thereby providing a dispersion 1 of red-light-emitting nanocrystals. The dispersion had an EOEOA content of 65.5% by mass.

Next, 0.28 g of Finedic A-254 (available from DIC Corporation, "Finedic" is a registered trademark) serving as a thermosetting resin, 0.09 g of 1-methylcyclohexane-4,5-dicarboxylic anhydride (available from Tokyo Chemical Industry Co., Ltd.), and 0.004 g of dimethylbenzylamine were dissolved in 1,4-butanediol diacetate to prepare a thermosetting resin solution 1 (non-volatile content: 30% by mass).

After 2.25 g of the dispersion 1 containing light-emitting nanocrystals, 0.75 g of the light diffusing particle dispersion 1, and 1.25 g of the thermosetting resin solution 1 were mixed, the mixture was filtered with a filter having a pore size of 5 μm, thereby providing a red-light-emitting-nanocrystal-containing composition 3.

[Green-Light-Emitting-Nanocrystal-Containing Composition 1]

A green-light-emitting-nanocrystal-containing composition 1 was prepared in the same way as above, except that green-light-emitting nanocrystals (CdSe/ZnS oleylamine ligand, emission peak: 530 nm) was used in place of the red-light-emitting nanocrystals CdSe/ZnS in the red-light-emitting-nanocrystal-containing composition.

[Green-Light-Emitting-Nanocrystal-Containing Composition 2]

A green-light-emitting-nanocrystal-containing composition 2 was prepared in the same way as above, except that green-light-emitting nanocrystals (InP/ZnS oleylamine ligand, emission peak: 620 nm) was used in place of the red-light-emitting nanocrystals CdSe/ZnS in the red-light-emitting-nanocrystal-containing composition.

[Green-Light-Emitting-Nanocrystal-Containing Composition 3]

First, 5 g of trioctylphosphine oxide (TOPO), 1.46 g (5 mmol) of indium acetate, and 3.16 g (15.8 mmol) of lauric acid were added to a reaction flask to prepare a mixture. The mixture was heated at 160° C. for 40 minutes in a nitrogen ($N_2$) environment and then heated under vacuum at 250° C. for 20 minutes. The reaction temperature (the temperature of the mixture) was increased to 300° C. in the nitrogen ($N_2$) environment. At this temperature, a mixture of 3 g of 1-octadecene (ODE) and 0.25 g (1 mmol) of tris(trimethylsilyl)phosphine was rapidly introduced into the reaction flask. The reaction temperature was maintained at 260° C. After 5 minutes, a heater was removed to stop the reaction. The resulting reaction solution was cooled to room temperature. Then 8 ml of toluene and 20 ml of ethanol were added to the reaction solution in a glove box. Subsequently, centrifugal separation was performed to precipitate InP nanocrystalline particles (InP cores). The decantation of the supernatant fluid resulted in the InP nanocrystal particles (InP cores). The resulting InP nanocrystalline particles (InP cores) were dispersed in hexane, thereby preparing a dispersion (hexane dispersion) containing 5% by mass InP nanocrystalline particles (InP cores).

To a reaction flask, 2.5 g of the hexane dispersion of InP nanocrystalline particles (InP cores) was added. Then 0.7 g of oleic acid was added to the reaction flask at room temperature. The temperature thereof was increased to 80° C. Subsequently, 1 ml of ODE containing 14 mg of diethylzinc, 8 mg of bis(trimethylsilyl)selenide, and 7 mg of hexamethyldisilathiane dissolved therein (ZnSeS precursor solution) was added dropwise to the reaction mixture, thereby forming ZnSeS shells having a thickness of 0.5 monolayer.

After dropwise addition of the ZnSeS precursor solution, the reaction temperature was maintained at 80° C. for 10 minutes. The temperature was increased to 140° C. and maintained for 30 minutes. A ZnS precursor solution prepared by dissolving 69 mg of diethylzinc and 66 mg of hexamethyldisilathiane in 2 ml of ODE was added dropwise to the reaction mixture, thereby forming ZnS shells having a thickness of 2 monolayers. After 10 minutes of the dropwise addition of ZnS precursor solution, a heater was removed to stop the reaction. The reaction mixture was cooled to room temperature. The resulting white precipitate was removed by centrifugal separation, thereby providing a transparent nanocrystalline particle dispersion (ODE dispersion) containing green-light-emitting InP/ZnSeS/ZnS nanocrystalline particles dispersed therein.

Then 30 mg of the organic ligand was added to the 1 ml of ODE dispersion of the InP/ZnSeS/ZnS nanocrystalline particles. The mixture was heated at 90° C. for 5 hours to exchange the ligand. The nanocrystalline particles aggregated as the ligand exchange proceeded. After the completion of the ligand exchange, the supernatant fluid was decanted. To the resulting nanocrystalline particles, 3 ml of ethanol was added. The mixture was subjected to ultrasonic treatment to perform redispersion. Then 10 ml of n-hexane was added to 3 mL of the ethanol dispersion of the nanocrystalline particles. Subsequently, centrifugal separation was performed to precipitate nanocrystalline particles. The decantation of the supernatant fluid and evaporation were performed under vacuum to provide nanocrystalline particles (InP/ZnSeS/ZnS nanocrystalline particles modified with the organic ligand). The organic ligand content was 35% by mass based on the total amount of the nanocrystalline particles modified with the organic ligand. The nanocrystalline particles (the InP/ZnSeS/ZnS nanocrystalline particles modified with the organic ligand) were dispersed in EOEOA in such a manner that the resulting dispersion had a nanocrystalline particle content of 30.0% by mass, thereby providing a dispersion 1 of green-light-emitting nanocrystalline particles. The dispersion had an EOEOA content of 70.0% by mass.

A green-light-emitting-nanocrystal-containing composition 3 was prepared as in the red-light-emitting-nanocrystal-containing composition 3, except that the dispersion 1 of green-light-emitting nanocrystalline particles was used in place of the dispersion 1 of the red-light-emitting nanocrystalline particles.

[Blue-Coloring Composition 1]

A blue-coloring composition 1 was prepared as described below. Propylene glycol monomethyl ether acetate, DISPERBYK LPN21116 (available from BYK Chemie), and zirconia beads "ER-120S" having a diameter of 0.3 to 0.4 mm, available from Saint-Gobain, were mixed and dispersed with a paint conditioner (available from Toyo Seiki Seisakusho, Ltd.) for 4 hours. The mixture was filtered with a filter having a pore size of 1 μm to prepare a dispersion. Then 75 parts by mass of the dispersion, 5.5 parts by mass of a polyester acrylate resin (Aronix (trade name) M7100, available from Toagosei Co., Ltd.), 5 parts by mass of dipentaerythritol hexaacrylate (KAYARAD (trade name) DPHA, available from Nippon Kayaku Co., Ltd.), 1 part by mass of benzophenone (Kayacure (trade name) BP-100, available from Nippon Kayaku Co., Ltd.), and 13.5 parts by mass of UCAR Ester EEP were stirred with a dispersion stirrer and filtered with a filter having a pore size of 1.0 μm to provide a blue-coloring composition 1.

[Blue-Coloring Composition 2]

A blue-coloring composition 2 was prepared as described below. A blue dye 1 (C.I. Solvent Blue 7) was placed in a plastic container. Propylene glycol monomethyl ether acetate, DISPERBYK LPN21116 (available from BYK Chemie), and zirconia beads "ER-120S" having a diameter of 0.3 to 0.4 mm, available from Saint-Gobain, were added thereto. The mixture was dispersed with a paint conditioner (available from Toyo Seiki Seisaku-sho, Ltd.) for 4 hours and then filtered with a filter having a pore size of 1 μm to prepare the dispersion.

[Preparation of Light-Scattering Composition ScB]

A light-scattering ink composition ScB was prepared as in the red-light-emitting nanocrystal-containing composition 3, except that 1,4-butanediol diacetate was used in place of the dispersion 1 of the red-light-emitting nanocrystals (containing the InP/ZnS core-shell nanocrystals (that emits red light)).

(B) Production of Light Conversion Layer (B-1) Photolithography Method

A red-light-emitting-nanocrystal-containing composition was applied in a thickness of 2 μm by spin coating to a glass substrate on which a black matrix and TFTs had been formed in advance. After drying at 70° C. for 20 minutes, the resulting film was subjected to striped-pattern exposure using ultraviolet radiation with an exposure machine including an ultra-high pressure mercury lamp through a photomask. The film was subjected to spray development with an alkaline developer for 90 seconds, washed with ion-exchanged water, and dried in air. Additionally, post baking was performed in a clean oven at 180° C. for 30 minutes, thereby forming red pixels, which were a stripe-shaped coloring layer, on the transparent substrate.

A green-light-emitting-nanocrystal-containing composition was also applied in a thickness of 2 μm by spin coating and dried. A strip-shaped coloring layer was exposed and developed at a position shifted from the red pixels with an exposure machine, thereby forming green pixels adjacent to the red pixels.

A glass substrate including a light conversion layer 1 or 3 disposed on a surface thereof and the TFTs stacked thereon, the light conversion layer including stripe-shaped pixels of three colors of red, green, and blue, was produced so as to have a structure described in Table 1 with the light-emitting-nanocrystal-containing composition for each color and the coloring composition.

The blue-coloring composition 2 was applied to the entire surface of the substrate 1 and irradiated with ultraviolet radiation to produce a glass substrate including a light conversion layer 2 on a surface thereof and the TFTs stacked thereon, the light conversion layer including a blue layer disposed on the entire surface of the stripe-shaped pixels of three colors of red, green, and blue.

TABLE 1

| | Light conversion layer 1 | Light conversion layer 2 | Light conversion layer 3 |
|---|---|---|---|
| R pixel portion | red-light-emitting-nanocrystal-containing composition 1 | red-light-emitting-nanocrystal-containing composition 1 | red-light-emitting-nanocrystal-containing composition 2 |
| G pixel portion | green-light-emitting-nanocrystal-containing composition 1 | green-light-emitting-nanocrystal-containing composition 1 | green-light-emitting-nanocrystal-containing composition 2 |
| B pixel portion | blue-coloring composition 1 (without blue-light-emitting nanocrystal) | blue-coloring composition 1 (without blue-light-emitting nanocrystal) | blue-coloring composition 1 (without blue-light-emitting nanocrystal) |
| Blue pixel on entire pixel | no | blue-coloring composition 2 | |

(B-2) Inkjet Method

Metallic chromium was sputtered on a glass substrate composed of alkali-free glass ("OA-10G", available from Nippon Electric Glass Co., Ltd.) and then formed into a pattern by a photolithography method. A photoresist SU-8 (available from Nippon Kayaku Co., Ltd.) was applied, exposed, developed, and post-baked, thereby forming an SU-8 pattern on the chromium pattern.

The resulting bank pattern was designed to be a pattern including opening portions corresponding to 100 μm×300 μm subpixels and had a line width of 20 μm and a thickness of 8 μm. The BM substrate was used for the formation of a light conversion layer.

A solid pattern was similarly formed. The contact angle of a solvent (1,4-BDDA) used as an ink was measured and found to be 45°. This indicated that the pattern was solvent-repellent.

The red-light-emitting-nanocrystal-containing composition 3, the green-light-emitting-nanocrystal-containing composition 3, and the light-scattering composition ScB were ejected to the opening portions with an inkjet printer (trade mane "DMP-2850", available from FUJIFILM Dimatix). A head unit of the inkjet printer, the head unit being configured to eject the inks, had 16 nozzles. The mount of each of the ink composition used per ejection was 10 μL per nozzle.

A black matrix (hereinafter, also referred to as "BM") was disposed on the platen (base table) of DMP-2850. The pattern of the black matrix on the base and the scanning direction of the head were matched. Alignment was performed. An ink was ejected to the opening portions of BM at an ejection rate of 6 m/s.

The inks were ejected to form films in such a manner that the thickness of the cured film of each ink was 80% or more of the thickness of the bank of the black matrix. The thickness of the cured film of the ink that had been applied by printing to the opening portions of the BM and cured was measured with an optical interference film thickness meter (Vert Scan).

The drying and curing treatment of the ink were performed as described below.

In the case where the ink was a thermosetting ink, a solvent was contained and thus evaporated under reduced pressure. In a nitrogen atmosphere in a glove box, the ink was cured by heating at 100° C. for 3 minutes and then 150° C. for 30 minutes.

As described above, a pixel portion to convert blue light into red light, a pixel portion to convert blue light into green light, and a pixel portion that was composed of the light-scattering material-containing dispersion free from a light-emitting nanocrystal and that transmitted blue light (without color conversion) were formed on the BM substrate. By the above-described operation, a patterned light conversion layer 4 including the multiple pixel portions was formed.

(Production of Light-Emitting Device or Image Display Apparatus)

(Production of Light-Emitting Device 1 and Image Display Apparatuses 1A to 4A)

ITO electrodes were vapor-deposited on the light conversion layers of the surfaces of the glass substrates including TFTs and the light conversion layers 1 to 4. A light-emitting device 1 including an electroluminescent layer configured to emit blue light was formed on each ITO electrode by a method described in "Appl. Mater. Interfaces 2013, 5, 7341-7351". The ITO electrode and the TFT layer were electrically connected through a contact hole. Thereby, image display apparatuses 1 to 4 corresponding to the light conversion layers 1 to 4 were produced. The light-emitting device 1 including the electroluminescent layer configured to emit blue light has a specific structure described below.

As the hole transport layer of the light-emitting device 1, TAPC illustrated below was used.

[Chem. 32]

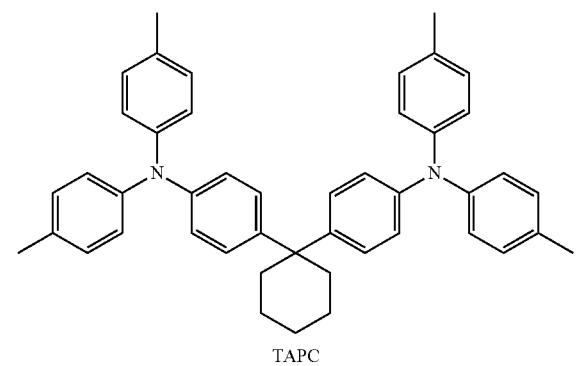

TAPC

As the electron-blocking layer of the light-emitting device 1, mCP illustrated below was used.

[Chem. 33]

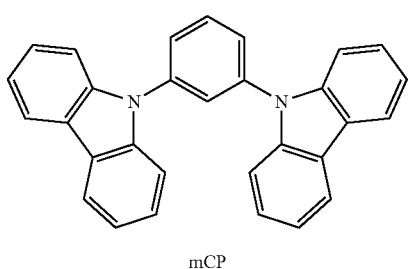

mCP

A compound illustrated below was used as a light-emitting material (dopant) of the first light-emitting layer of the light-emitting device 1.

[Chem. 34]

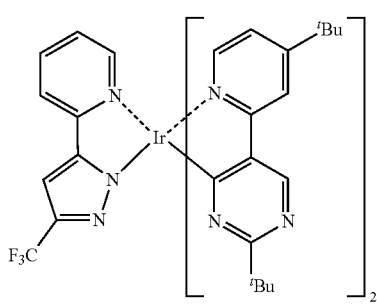

As the host material of the first light-emitting layer of the light-emitting device 1, mCP illustrated below was used.

[Chem. 35]

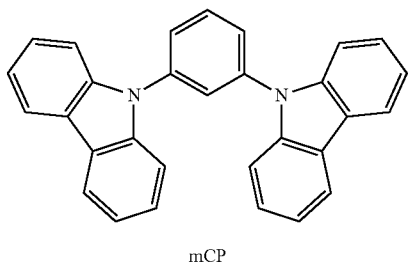

mCP

A compound illustrated below was used as a light-emitting material (dopant) of a second light-emitting layer of the light-emitting device 1.

[Chem. 36]

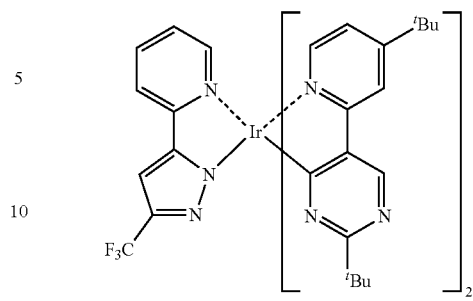

As the host material of the second light-emitting layer of the light-emitting device 1, UGH2 illustrated below was used.

[Chem. 37]

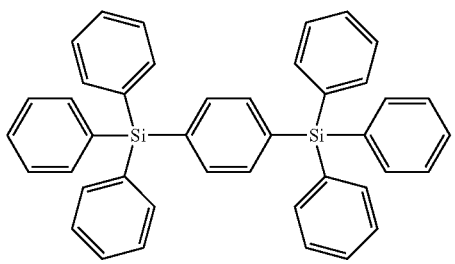

UGH2

As the hole-blocking layer of the light-emitting device 1, UGH2 illustrated above was used.
As the electron transport layer of the light-emitting device 1, a compound illustrated below was used.

[Chem. 38]

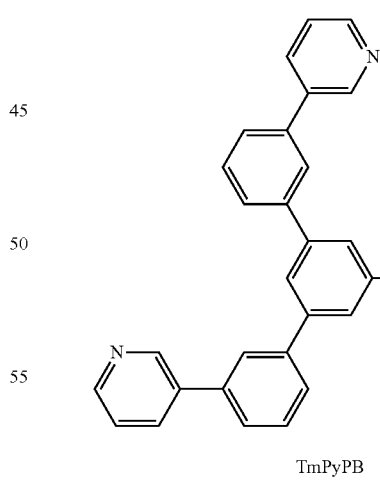

TmPyPB

The hole transport layer, the electron-blocking layer, the first light-emitting layer, the second light-emitting layer, the hole-blocking layer, and the electron transport layer were formed, in this order, by patterning on each ITO electrode. A blue-light-emitting layer was formed by a method described in "Appl. Mater. Interfaces 2013, 5, 7341-7351. A solid (LiF/Al) electrode serving as a cathode and a solid protective layer were formed and stacked in this order. Thereby, image display apparatuses 1A to 4A including the light-emitting devices configured to emit blue light were produced.

(Production of Light-Emitting Device 2 and Image Display Apparatuses 1B to 4B)

ITO electrodes were vapor-deposited on the light conversion layers of the surfaces of the glass substrates including TFTs and the light conversion layers 1 to 4. A light-emitting device 2 including an electroluminescent layer configured to emit blue light was formed on each ITO electrode by a method described in "J. Mater. Chem. C, 2014, 2, 6040-6047". The ITO electrode and the TFT layer were electrically connected through a contact hole. Thereby, image display apparatuses 1B to 4B corresponding to the light conversion layers 1 to 4 were produced.

The light-emitting device 2 including the electroluminescent layer configured to emit blue light has a specific structure described below.

As the hole transport layer of the light-emitting device 2, TAPC illustrated below was used.

[Chem. 39]

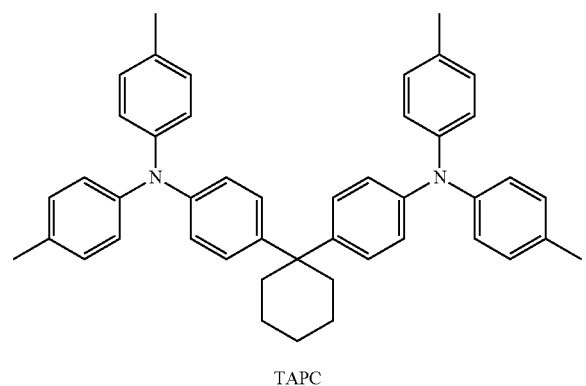

TAPC

As the electron-blocking layer of the light-emitting device 2, mCP illustrated below was used.

[Chem. 40]

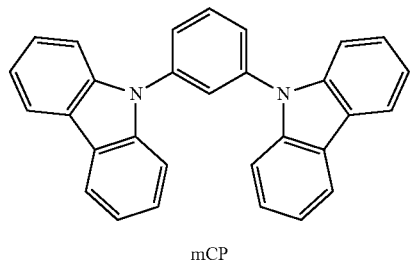

mCP

A compound illustrated below was used as a light-emitting material (dopant) of the light-emitting layer of the light-emitting device 2.

[Chem. 41]

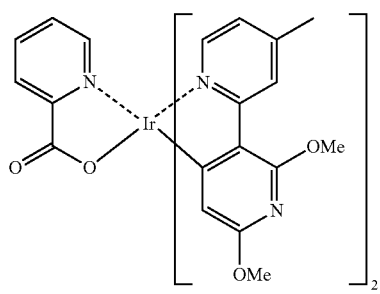

As the host material of the light-emitting layer of the light-emitting device 2, mCPPO1 illustrated below was used.

[Chem. 42]

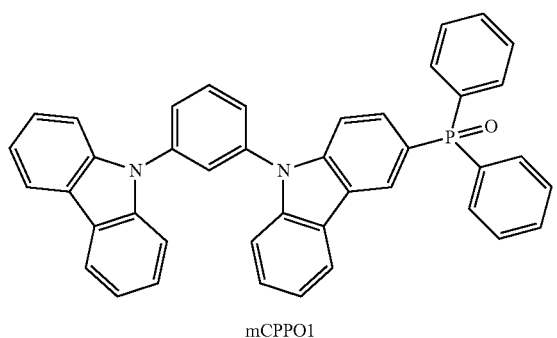

mCPPO1

As the electron transport layer of the light-emitting device 2, a compound illustrated below was used.

[Chem. 43]

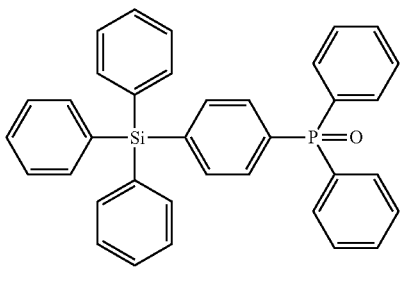

TSPO1

The hole transport layer, the electron-blocking layer, the light-emitting layer, the hole-blocking layer, and the electron transport layer were formed, in this order, by patterning on each ITO electrode. A blue-light-emitting layer was then formed. A solid (LiF/Al) electrode serving as a cathode and a solid protective layer were formed and stacked in this order. Thereby, image display apparatuses 1B to 4B including the light-emitting devices configured to emit blue light were produced.

The color gamuts of the resulting image display apparatuses 1A to 4A and 1B to 4B were measured.

Comparisons of any of the image display apparatuses including the light conversion layers with the conventional organic EL apparatuses that did not include a light conversion layer indicated that the former had expanded color gamuts.

REFERENCE SIGNS LIST 1 substrate
2 first electrode
3 hole injection layer
4 hole transport layer
5 light-emitting layer
6 electron transport layer
7 electron injection layer
8 second electrode
9 light conversion layer
10 overcoat layer (protective layer)
11 substrate
20 transistor layer
100 light-emitting device
101 image display apparatus
701 capacitor
702 driver transistor
703 power supply line
705 common electrode
706 signal line
707 scan line
708 switching transistor

The invention claimed is:

1. A light-emitting device, comprising:
a pair of electrodes including a first electrode and a second electrode disposed opposite each other;
an electroluminescent layer disposed between the first electrode and the second electrode; and
a light conversion layer including multiple pixels and converting light that is emitted from the electroluminescent layer and that has a blue emission spectrum into light having a different wavelength,
wherein the light conversion layer includes pixels of three primary colors of red (R), green (G), and blue (B) and contains a light-emitting nanocrystal having an emission spectrum in any of red (R), green (G), and blue (B) when light from the electroluminescent layer is incident on at least one of the three primary colors and a transparent resin,
in the light conversion layer, a content of the light-emitting nanocrystals with respect to the transparent resin is 1.0 parts by mass or more and 80 parts by mass or less based on 100 parts by mass of the transparent resin, and
in the light conversion layer, the light-emitting nanocrystal includes a core containing a first semiconductor material, a first shell covering the core and containing a second semiconductor material different from that of the core and the first shell, and a second shell comprising a third semiconductor material different from that of the first shell.

2. The light-emitting device according to claim 1, wherein the electroluminescent layer contains one or two or more light-emitting materials selected from the group consisting of an inorganic light-emitting material, a low-molecular-weight fluorescent material, an organic polymer fluorescent material, a phosphorescent material, and a thermally activated delayed fluorescent material.

3. The light-emitting device according to claim 2, wherein the low-molecular-weight fluorescent material is a compound having at least one selected from the group consisting of an anthracene moiety, a tetracene moiety, a chrysene moiety, a phenanthrene moiety, a pyrene moiety, a perylene moiety, a stilbene moiety, an acridone moiety, a coumarin moiety, a phenoxazine moiety, and a phenothiazine moiety.

4. The light-emitting device according to claim 2, wherein the phosphorescent material is a metal complex containing at least one metal atom selected from the group consisting of iridium, rhodium, platinum, ruthenium, osmium, scandium, yttrium, gadolinium, palladium, silver, gold, and aluminum.

5. The light-emitting device according to claim 2, wherein the light-emitting material contains one or two or more host materials each having a larger energy gap than the light-emitting material.

6. The light-emitting device according to claim 1, wherein in the light conversion layer, an emission spectrum of at least one of red (R), green (G), and blue (B) has a full width at half maximum of 20 to 50 nm.

7. The light-emitting device according to claim 1, wherein the first semiconductor material is a III-V group semiconductor the second semiconductor material is a II-VI group semiconductor.

8. An image display apparatus characterized by having a light emitting device according to claim 1, comprising a transistor layer electrically connected to the first electrode or the second electrode, wherein the light emitted from the electroluminescent layer is displayed through the light conversion layer and the transistor layer.

9. An image display apparatus characterized by having a light emitting device according to claim 1, comprising a transistor layer electrically connected to the first electrode or the second electrode, wherein the light emitted from the electroluminescent layer is displayed without passing through the transistor layer.

10. The light-emitting device according to claim 1, wherein the first semiconductor material is InP, and the second semiconductor material and the third semiconductor material are II-VI group semiconductors.

11. The light-emitting device according to claim 1, wherein the content of the light-emitting nanocrystals with respect to the transparent resin is 3.0 parts by mass or more and 70 parts by mass or less based on 100 parts by mass of the transparent resin.

12. The light-emitting device according to claim 1, wherein the content of the light-emitting nanocrystals with respect to the transparent resin is 5.0 parts by mass or more and 60 parts by mass or less based on 100 parts by mass of the transparent resin.

13. The light-emitting device according to claim 1, wherein the content of the light-emitting nanocrystals with respect to the transparent resin is 5.0 parts by mass or more and 50 parts by mass or less based on 100 parts by mass of the transparent resin.

* * * * *